(12) United States Patent
Levitan et al.

(10) Patent No.: US 12,294,396 B2
(45) Date of Patent: May 6, 2025

(54) ADAPTIVE DIGITAL PRE-DISTORTION

(71) Applicant: QUALCOMM Incorporated, San Diego, CA (US)

(72) Inventors: Evgeny Levitan, Haifa (IL); Evyatar Hemo, Kiryat Bialik (IL); Moshe Bino, Tirat Carmel (IL); Ariel Sagi, Haifa (IL); Ilia Antsiferov, Netanya (IL); Amichai Sanderovich, Atlit (IL)

(73) Assignee: QUALCOMM Incorporated, San Diego, CA (US)

( * ) Notice: Subject to any disclaimer, the term of this patent is extended or adjusted under 35 U.S.C. 154(b) by 484 days.

(21) Appl. No.: 17/812,611

(22) Filed: Jul. 14, 2022

(65) Prior Publication Data

US 2024/0022271 A1  Jan. 18, 2024

(51) Int. Cl.
*H04B 1/62* (2006.01)
*H04B 1/04* (2006.01)
*H04L 25/03* (2006.01)

(52) U.S. Cl.
CPC ..... *H04B 1/0475* (2013.01); *H04L 25/03853* (2013.01); *H04B 2001/0425* (2013.01)

(58) Field of Classification Search
CPC .......... H04B 1/0475; H04B 2001/0425; H04L 25/03853; H04L 25/03343; H04L 27/368;
(Continued)

(56) References Cited

U.S. PATENT DOCUMENTS

2006/0046665 A1* 3/2006 Yang ..................... H04L 27/368
455/114.3

2013/0138416 A1* 5/2013 Verspecht ............. H03F 1/3247
703/13
(Continued)

FOREIGN PATENT DOCUMENTS

WO   WO-2014195830 A1 * 12/2014 ........... H03F 1/3247

OTHER PUBLICATIONS

Afsardoost S., et al., "Digital Predistortion Using A Vector-Switched Model", IEEE Transactions on Microwave Theory and Techniques, IEEE, USA, vol. 60, No. 4, Apr. 1, 2012, pp. 1166-1174, XP011439786, ISSN: 0018-9480, DOI: 10.1109/TMTT.2012.2184295, Sections I, II figure 1.

(Continued)

*Primary Examiner* — Siu M Lee
(74) *Attorney, Agent, or Firm* — Harrity & Harrity LLP

(57) ABSTRACT

Various aspects of the present disclosure generally relate to wireless communication. In some aspects, an apparatus may receive an indication of a selected digital pre-distortion (DPD) kernel from multiple DPD kernels. The apparatus may store multiple envelope values associated of with samples of an in-phase/quadrature (I/Q) signal and select a subset of envelope values based at least in part on the selected DPD kernel. The apparatus may generate, using the subset of envelope values and a look-up-table (LUT) component, an envelope computation value. The apparatus may store multiple computational values associated with the samples and select, based at least in part on the selected DPD kernel, at least one subset of computational values. The apparatus may generate an output sample that includes DPD based at least in part on combining the envelope computation value with the at least one subset of computational values. Numerous other aspects are described.

30 Claims, 10 Drawing Sheets

(58) Field of Classification Search
CPC . H04L 2025/03535; H04L 2025/03547; H03F 1/3247; H03F 1/3258; H03F 2200/451; H03F 3/195; H03F 3/245
See application file for complete search history.

(56) References Cited

U.S. PATENT DOCUMENTS

2015/0381216 A1   12/2015   Shor et al.
2023/0370023 A1*  11/2023   Yu .................... G05B 13/027

OTHER PUBLICATIONS

International Search Report and Written Opinion—PCT/US2023/068898—ISA/EPO—Sep. 25, 2023.
Quindroit C., et al., "FPGA Implementation Of Orthogonal 2D Digital Predistortion System For Concurrent Dual-Band Power Amplifiers Based On Time-Division Multiplexing", IEEE Transactions on Microwave Theory and Techniques, IEEE, USA, vol. 61, No. 12, Dec. 1, 2013, pp. 4591-4599, XP011531946, ISSN: 0018-9480, DOI: 10.1109/TMTT.2013.2288220, Sections II, III figures 2-5.

* cited by examiner

| Kernel Type 604 | $q_j$ 606 | $p_m$ 608 |
|---|---|---|
| GMP (GDDR1) Type 1 | 1 | $x_m$ |
| GDDR1 Type 2 | $x_0^2$ | $x_m^*$ |
| GDDR2 Type 1 | $x_0^*$ | $x_m^2$ |
| GDDR2 Type 2 | $x_0$ | $|x_m|^2$ |
| GDDR2 Type 3 | $x_0^3$ | $x_m^{*2}$ |
| GDDR3 Type 1 | 1 | $|x_m|^2 x_m$ |
| GDDR3 Type 2 | $x_0^{*2}$ | $x_m^3$ |
| GDDR3 Type 3 | $x_0^2$ | $|x_m|^2 x_m^*$ |
| $x^*|x||x|^k$ | $x_j^*$ | $|x_m|$ |
| $xx^*|x|^k$ | $x_j$ | $x_m^*$ |
| $x^2|x|^2|x|^k$ | $x_j^2$ | $|x|^2$ |

FIG. 6

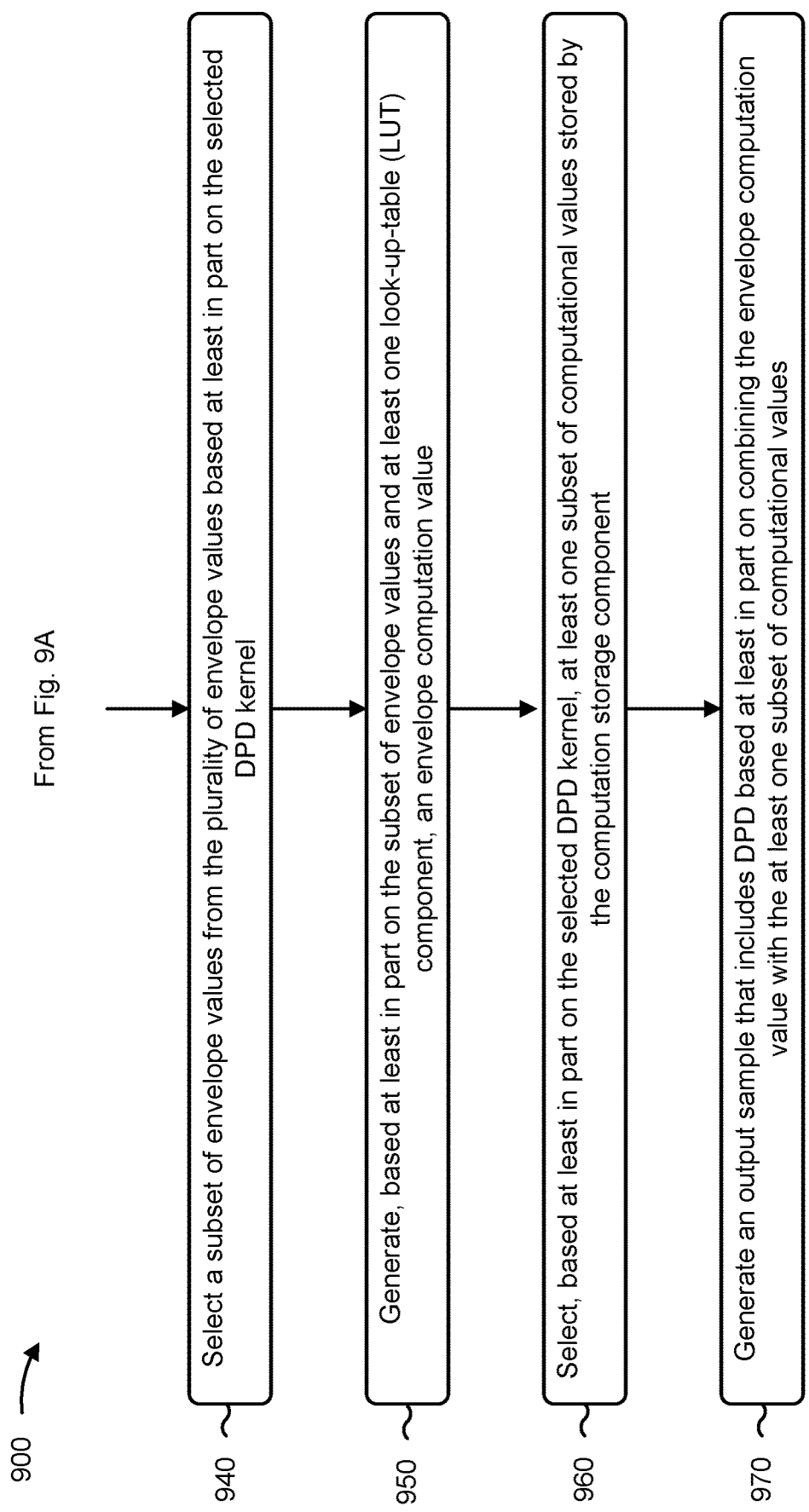

ADAPTIVE DIGITAL PRE-DISTORTION

FIELD OF THE DISCLOSURE

Aspects of the present disclosure generally relate to wireless communication and to techniques and apparatuses for adaptive digital pre-distortion.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include one or more network nodes that support communication for wireless communication devices, such as a user equipment (UE) or multiple UEs. A UE may communicate with a network node via downlink communications and uplink communications. "Downlink" (or "DL") refers to a communication link from the network node to the UE, and "uplink" (or "UL") refers to a communication link from the UE to the network node. Some wireless networks may support device-to-device communication, such as via a local link (e.g., a sidelink (SL), a wireless local area network (WLAN) link, and/or a wireless personal area network (WPAN) link, among other examples).

The above multiple access technologies have been adopted in various telecommunication standards to provide a common protocol that enables different UEs to communicate on a municipal, national, regional, and/or global level. New Radio (NR), which may be referred to as 5G, is a set of enhancements to the LTE mobile standard promulgated by the 3GPP. NR is designed to better support mobile broadband internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink, using CP-OFDM and/or single-carrier frequency division multiplexing (SC-FDM) (also known as discrete Fourier transform spread OFDM (DFT-s-OFDM)) on the uplink, as well as supporting beamforming, multiple-input multiple-output (MIMO) antenna technology, and carrier aggregation. As the demand for mobile broadband access continues to increase, further improvements in LTE, NR, and other radio access technologies remain useful.

SUMMARY

Some aspects described herein relate to an apparatus for wireless communication at a device. The apparatus may include a first input mechanism configured to receive an indication of a selected digital pre-distortion (DPD) kernel from a plurality of DPD kernels. Alternatively or additionally, the apparatus may include an envelope delay line component that includes an envelope storage component configured to store an input envelope value as one of a plurality of envelope values associated with a plurality of samples that are sampled over a time duration. The apparatus may include an envelope selection component configured to select a subset of envelope values from the plurality of envelope values based at least in part on the selected DPD kernel. In some aspects, the apparatus may include at least one look-up-table (LUT) component coupled to the envelope selection component. The at least one LUT component may include a second input mechanism configured to receive the subset of envelope values, an output component configured to output an envelope computation value that is based at least in part on the subset of envelope values. The apparatus may include a computation delay line component that includes a computation storage component. The computation storage component of the computation delay line component may be configured to store at least a first plurality of computational values that are based at least in part on a first computation applied to each sample of the plurality of samples, a second plurality of computational values that are based at least in part on a second computation applied to each sample of the plurality of samples, and the plurality of samples that span the time duration. In some aspects, the apparatus may include at least one computation selection component coupled to the computation delay line component and configured to select, based at least in part on the selected DPD kernel, at least one subset of computational values stored by the computation storage component. Alternatively or additionally, the apparatus may include at least one combiner component coupled to the at least one computation selection component and the at least one LUT component. The at least one combiner component may be configured to generate an output sample based at least in part on combining the envelope computation value with the at least one subset of computational values.

Some aspects described herein relate to a method performed by an apparatus. The method may include receiving an indication of a selected DPD kernel from a plurality of DPD kernels. The method may include storing, based at least in part on an envelope delay line component, an envelope value associated with a sample of an I/Q signal, the storing comprising storing the envelope value as one of a plurality of envelope values that span a time duration, the plurality of envelope values based at least in part on a plurality of samples associated with the I/Q signal. The method may include storing, based at least in part on a computation storage component, at least, a first computational value as one of a first plurality of computational values, the first plurality of computational values being based at least in part on the plurality of samples, the first computational value being based at least in part on a first computation applied to the sample a second computational value as one of a second plurality of computational values, the second plurality of computational values being based at least in part on the plurality of samples, the second computational value being based at least in part on a second computation applied to the sample the plurality of samples. The method may include selecting a subset of envelope values from the plurality of envelope values based at least in part on the selected DPD kernel. The method may include generating, based at least in part on the subset of envelope values, at least one LUT component, and the selected DPD kernel, an envelope computation value. The method may include selecting, based at least in part on the selected DPD kernel, at least one subset of computational values stored by the computation storage component. The method may include generating an output sample that includes digital pre-distortion based at least in part on combining the envelope computation value with the at least one subset of computational values.

Some aspects described herein relate to a non-transitory computer-readable medium that stores a set of instructions for wireless communication by an apparatus. The set of instructions, when executed by one or more processors of apparatus, may cause the apparatus to receive an indication of a selected DPD kernel from a plurality of DPD kernels. The set of instructions, when executed by one or more processors of the apparatus, may cause the apparatus to store, based at least in part on an envelope delay line component, an envelope value associated with a sample of an I/Q signal, the storing comprising storing the envelope value as one of a plurality of envelope values that span a time duration, the plurality of envelope values based at least in part on a plurality of samples associated with the I/Q signal. In some aspects, the set of instructions, when executed by one or more processors of the apparatus, may cause the apparatus to store, based at least in part on a computation storage component, at least a first computational value as one of a first plurality of computational values, the first plurality of computational values being based at least in part on the plurality of samples, the first computational value being based at least in part on a first computation applied to the sample. Alternatively or additionally, the set of instructions, when executed by the one or more processors of the apparatus, may cause the apparatus to store, based at least in part on the computation storage component, a second computational value as one of a second plurality of computational values, the second plurality of computational values being based at least in part on the plurality of samples, the second computational value being based at least in part on a second computation applied to the sample. In some aspects, the set of instructions, when executed by one or more processors of the apparatus, may cause the apparatus to store, based at least in part on a computation storage component, the plurality of samples. The set of instructions, when executed by one or more processors of apparatus, may cause the apparatus to select a subset of envelope values from the plurality of envelope values based at least in part on the selected DPD kernel. The set of instructions, when executed by one or more processors of apparatus, may cause the apparatus to generate, based at least in part on the subset of envelope values, the selected DPD kernel, and the at least one LUT component, an envelope computation value. The set of instructions, when executed by one or more processors of the apparatus, may cause the apparatus to select, based at least in part on the selected DPD kernel, at least one subset of computational values stored by the computation storage component. The set of instructions, when executed by one or more processors of the apparatus, may cause the apparatus to generate an output sample that includes digital pre-distortion based at least in part on combining the envelope computation value with the at least one subset of computational values.

Some aspects described herein relate to an apparatus for wireless communication. The apparatus may include means for receiving an indication of a selected DPD kernel from a plurality of DPD kernels. The apparatus may include means for storing, based at least in part on an envelope delay line component, an envelope value associated with a sample of an I/Q signal, the storing comprising storing the envelope value as one of a plurality of envelope values that span a time duration, the plurality of envelope values based at least in part on a plurality of samples associated with the I/Q signal. The apparatus may include means for storing, based at least in part on a computation storage component, at least, a first computational value as one of a first plurality of computational values, the first plurality of computational values being based at least in part on the plurality of samples, the first computational value being based at least in part on a first computation applied to the sample a second computational value as one of a second plurality of computational values, the second plurality of computational values being based at least in part on the plurality of samples, the second computational value being based at least in part on a second computation applied to the sample the plurality of samples. The apparatus may include means for selecting a subset of envelope values from the plurality of envelope values based at least in part on the selected DPD kernel. The apparatus may include means for generating, based at least in part on the subset of envelope values, at least one LUT component, and the selected DPD kernel, an envelope computation value. The apparatus may include means for selecting, based at least in part on the selected DPD kernel, at least one subset of computational values stored by the computation storage component. The apparatus may include means for generating an output sample that includes digital pre-distortion based at least in part on combining the envelope computation value with the at least one subset of computational values.

Some aspects described herein relate to an apparatus for wireless communication at a device. The apparatus may include a power amplifier, a digital-to-analog converter (DAC) coupled to the power amplifier, and an adaptable DPD apparatus coupled to the DAC. The adaptable DPD apparatus may include an envelope delay line component that includes an envelope storage component configured to store a plurality of envelope values associated with a plurality of samples of an I/Q signal. Alternatively or additionally, the adaptable DPD apparatus may include an envelope selection component configured to select a subset of envelope values from the plurality of envelope values and at least one LUT component coupled to the envelope selection component. The at least one LUT component may include an output mechanism configured to output an envelope computation value that is based at least in part on the subset of envelope values. The adaptable DPD apparatus may include a computation delay line component that includes a computation storage component configured to store a plurality of computational values that are based at least in part on the plurality of samples. The adaptable DPD apparatus may include at least one computation selection component coupled to the computation delay line component and configured to select, based at least in part on a selected DPD kernel of a plurality of DPD kernels, at least one subset of computational values stored by the computation storage component. In some aspects, the adaptable DPD apparatus includes at least one combiner component coupled to the at least one computation selection component and the at least one LUT component. The at least one combiner component may be configured to generate an output sample based at least in part on combining the envelope computation value with the at least one subset of computational values.

Aspects generally include a method, apparatus, system, computer program product, non-transitory computer-readable medium, user equipment, base station, network entity, network node, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages, will be better understood from the following description when considered in connection with the accompanying figures. Each of the figures is provided for the purposes of illustration and description, and not as a definition of the limits of the claims.

While aspects are described in the present disclosure by illustration to some examples, those skilled in the art will understand that such aspects may be implemented in many different arrangements and scenarios. Techniques described herein may be implemented using different platform types, devices, systems, shapes, sizes, and/or packaging arrangements. For example, some aspects may be implemented via integrated chip embodiments or other non-module-component based devices (e.g., end-user devices, vehicles, communication devices, computing devices, industrial equipment, retail/purchasing devices, medical devices, and/or artificial intelligence devices). Aspects may be implemented in chip-level components, modular components, non-modular components, non-chip-level components, device-level components, and/or system-level components. Devices incorporating described aspects and features may include additional components and features for implementation and practice of claimed and described aspects. For example, transmission and reception of wireless signals may include one or more components for analog and digital purposes (e.g., hardware components including antennas, radio frequency (RF) chains, power amplifiers, modulators, buffers, processors, interleavers, adders, and/or summers). It is intended that aspects described herein may be practiced in a wide variety of devices, components, systems, distributed arrangements, and/or end-user devices of varying size, shape, and constitution.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

FIG. 6 is a diagram illustrating an example of a table that specifies computations and/or values that may be used in a generalized DPD kernel, in accordance with the present disclosure.

FIGS. 9A and 9B are diagrams illustrating an example process performed, for example, by an apparatus, in accordance with the present disclosure.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. One skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

While aspects may be described herein using terminology commonly associated with a 5G or New Radio (NR) radio access technology (RAT), aspects of the present disclosure can be applied to other RATs, such as a 3G RAT, a 4G RAT, and/or a RAT subsequent to 5G (e.g., 6G).

Figure 1:
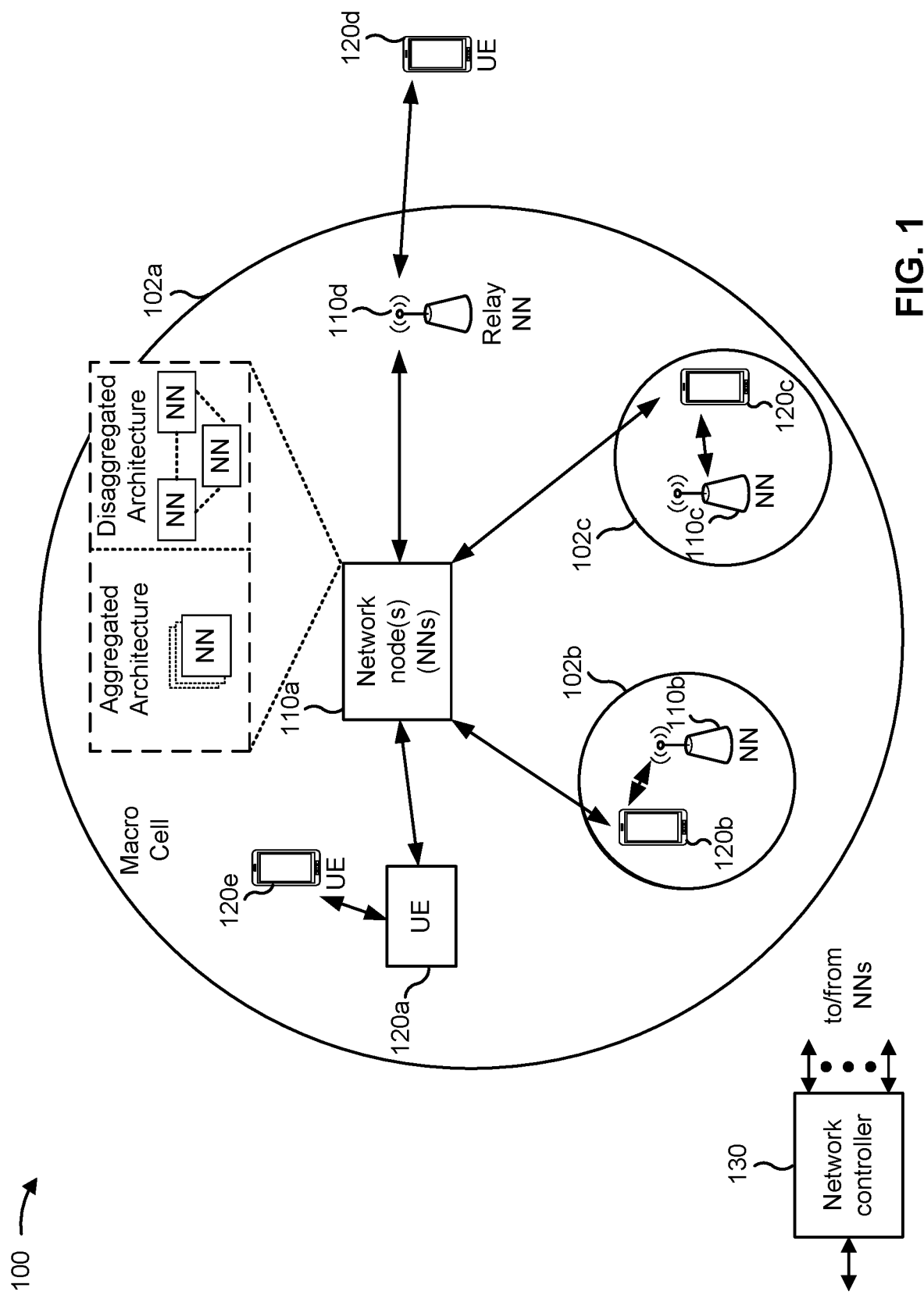
FIG. 1 is a diagram illustrating an example of a wireless network, in accordance with the present disclosure.

FIG. 1 is a diagram illustrating an example of a wireless network 100, in accordance with the present disclosure. The wireless network 100 may be or may include elements of a 5G (e.g., NR) network and/or a 4G (e.g., Long Term Evolution (LTE)) network, among other examples. The wireless network 100 may include one or more network nodes 110 (shown as a network node 110a, a network node 110b, a network node 110c, and a network node 110d), a user equipment (UE) 120 or multiple UEs 120 (shown as a UE 120a, a UE 120b, a UE 120c, a UE 120d, and a UE 120e), and/or other entities. A network node 110 is a network node that communicates with UEs 120. As shown, a network node 110 may include one or more network nodes. For example, a network node 110 may be an aggregated network node, meaning that the aggregated network node is configured to utilize a radio protocol stack that is physically or logically integrated within a single radio access network (RAN) node (e.g., within a single device or unit). As another example, a network node 110 may be a disaggregated network node (sometimes referred to as a disaggregated base station), meaning that the network node 110 is configured to utilize a protocol stack that is physically or logically distributed among two or more nodes (such as one or more central units (CUs), one or more distributed units (DUs), or one or more radio units (RUs)).

In some examples, a network node 110 is or includes a network node that communicates with UEs 120 via a radio access link, such as an RU. In some examples, a network node 110 is or includes a network node that communicates with other network nodes 110 via a fronthaul link or a midhaul link, such as a DU. In some examples, a network node 110 is or includes a network node that communicates with other network nodes 110 via a midhaul link or a core network via a backhaul link, such as a CU. In some examples, a network node 110 (such as an aggregated network node 110 or a disaggregated network node 110) may include multiple network nodes, such as one or more RUs, one or more CUs, and/or one or more DUs. A network node 110 may include, for example, an NR base station, an LTE base station, a Node B, an eNB (e.g., in 4G), a gNB (e.g., in 5G), an access point, a transmission reception point (TRP), a DU, an RU, a CU, a mobility element of a network, a core network node, a network element, a network equipment, a RAN node, or a combination thereof. In some examples, the network nodes 110 may be interconnected to one another or to one or more other network nodes 110 in the wireless network 100 through various types of fronthaul, midhaul, and/or backhaul interfaces, such as a direct physical connection, an air interface, or a virtual network, using any suitable transport network.

In some examples, a network node 110 may provide communication coverage for a particular geographic area. In the Third Generation Partnership Project (3GPP), the term "cell" can refer to a coverage area of a network node 110 and/or a network node subsystem serving this coverage area, depending on the context in which the term is used. A network node 110 may provide communication coverage for a macro cell, a pico cell, a femto cell, and/or another type of cell. A macro cell may cover a relatively large geographic area (e.g., several kilometers in radius) and may allow unrestricted access by UEs 120 with service subscriptions. A pico cell may cover a relatively small geographic area and may allow unrestricted access by UEs 120 with service subscriptions. A femto cell may cover a relatively small geographic area (e.g., a home) and may allow restricted access by UEs 120 having association with the femto cell (e.g., UEs 120 in a closed subscriber group (CSG)). A network node 110 for a macro cell may be referred to as a macro network node. A network node 110 for a pico cell may be referred to as a pico network node. A network node 110 for a femto cell may be referred to as a femto network node or an in-home network node. In the example shown in FIG. 1, the network node 110a may be a macro network node for a macro cell 102a, the network node 110b may be a pico network node for a pico cell 102b, and the network node 110c may be a femto network node for a femto cell 102c. A network node may support one or multiple (e.g., three) cells. In some examples, a cell may not necessarily be stationary, and the geographic area of the cell may move according to the location of a network node 110 that is mobile (e.g., a mobile network node).

In some aspects, the term "base station" or "network node" may refer to an aggregated base station, a disaggregated base station, an integrated access and backhaul (IAB) node, a relay node, or one or more components thereof. For example, in some aspects, "base station" or "network node" may refer to a CU, a DU, an RU, a Near-Real Time (Near-RT) RAN Intelligent Controller (RIC), or a Non-Real Time (Non-RT) RIC, or a combination thereof. In some aspects, the term "base station" or "network node" may refer to one device configured to perform one or more functions, such as those described herein in connection with the network node 110. In some aspects, the term "base station" or "network node" may refer to a plurality of devices configured to perform the one or more functions. For example, in some distributed systems, each of a quantity of different devices (which may be located in the same geographic location or in different geographic locations) may be configured to perform at least a portion of a function, or to duplicate performance of at least a portion of the function, and the term "base station" or "network node" may refer to any one or more of those different devices. In some aspects, the term "base station" or "network node" may refer to one or more virtual base stations or one or more virtual base station functions. For example, in some aspects, two or more base station functions may be instantiated on a single device. In some aspects, the term "base station" or "network node" may refer to one of the base station functions and not another. In this way, a single device may include more than one base station.

The wireless network 100 may include one or more relay stations. A relay station is a network node that can receive a transmission of data from an upstream node (e.g., a network node 110 or a UE 120) and send a transmission of the data to a downstream node (e.g., a UE 120 or a network node 110). A relay station may be a UE 120 that can relay transmissions for other UEs 120. In the example shown in FIG. 1, the network node 110d (e.g., a relay network node) may communicate with the network node 110a (e.g., a macro network node) and the UE 120d in order to facilitate communication between the network node 110a and the UE 120d. A network node 110 that relays communications may be referred to as a relay station, a relay base station, a relay network node, a relay node, a relay, or the like.

The wireless network 100 may be a heterogeneous network that includes network nodes 110 of different types, such as macro network nodes, pico network nodes, femto network nodes, relay network nodes, or the like. These different types of network nodes 110 may have different transmit power levels, different coverage areas, and/or different impacts on interference in the wireless network 100. For example, macro network nodes may have a high transmit power level (e.g., 5 to 40 watts) whereas pico network nodes, femto network nodes, and relay network nodes may have lower transmit power levels (e.g., 0.1 to 2 watts).

A network controller 130 may couple to or communicate with a set of network nodes 110 and may provide coordination and control for these network nodes 110. The network controller 130 may communicate with the network nodes 110 via a backhaul communication link or a midhaul communication link. The network nodes 110 may communicate with one another directly or indirectly via a wireless or wireline backhaul communication link. In some aspects, the network controller 130 may be a CU or a core network device, or may include a CU or a core network device.

The UEs 120 may be dispersed throughout the wireless network 100, and each UE 120 may be stationary or mobile. A UE 120 may include, for example, an access terminal, a terminal, a mobile station, and/or a subscriber unit. A UE 120 may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device, a biometric device, a wearable device (e.g., a smart watch, smart clothing, smart glasses, a smart wristband, smart jewelry (e.g., a smart ring or a smart bracelet)), an entertainment device (e.g., a music device, a video device, and/or a satellite radio), a vehicular component or sensor, a smart meter/sensor, industrial manufacturing equipment, a global positioning system device, a UE function of a network node, and/or any other suitable device that is configured to communicate via a wireless or wired medium.

Some UEs 120 may be considered machine-type communication (MTC) or evolved or enhanced machine-type communication (eMTC) UEs. An MTC UE and/or an eMTC UE may include, for example, a robot, a drone, a remote device, a sensor, a meter, a monitor, and/or a location tag, that may communicate with a network node, another device (e.g., a remote device), or some other entity. Some UEs 120 may be considered Internet-of-Things (IoT) devices, and/or may be implemented as NB-IoT (narrowband IoT) devices. Some UEs 120 may be considered a Customer Premises Equipment. A UE 120 may be included inside a housing that houses components of the UE 120, such as processor components and/or memory components. In some examples, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks 100 may be deployed in a given geographic area. Each wireless network 100 may support a particular RAT and may operate on one or more frequencies. A RAT may be referred to as a radio technology, an air interface, or the like. A frequency may be referred to as a carrier, a frequency channel, or the like. Each frequency may support a single RAT in a given geographic area in order to avoid interference between wireless networks of different RATs. In some cases, NR or 5G RAT networks may be deployed.

In some examples, two or more UEs 120 (e.g., shown as UE 120a and UE 120e) may communicate directly using one or more sidelink channels (e.g., without using a network node 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, or a vehicle-to-pedestrian (V2P) protocol), and/or a mesh network. In such examples, a UE 120 may perform scheduling operations, resource selection operations, and/or other operations described elsewhere herein as being performed by the network node 110.

Devices of the wireless network 100 may communicate using the electromagnetic spectrum, which may be subdivided by frequency or wavelength into various classes, bands, channels, or the like. For example, devices of the wireless network 100 may communicate using one or more operating bands. In 5G NR, two initial operating bands have been identified as frequency range designations FR1 (510 MHz-7.125 GHz) and FR2 (24.25 GHz-52.6 GHz). It should be understood that although a portion of FR1 is greater than 6 GHz, FR1 is often referred to (interchangeably) as a "Sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR4a or FR4-1 (52.6 GHz-71 GHz), FR4 (52.6 GHz-114.25 GHz), and FR5 (114.25 GHz-300 GHz). Each of these higher frequency bands falls within the EHF band.

With the above examples in mind, unless specifically stated otherwise, it should be understood that the term "sub-6 GHz" or the like, if used herein, may broadly represent frequencies that may be less than 6 GHz, may be within FR1, or may include mid-band frequencies. Further, unless specifically stated otherwise, it should be understood that the term "millimeter wave" or the like, if used herein, may broadly represent frequencies that may include mid-band frequencies, may be within FR2, FR4, FR4-a or FR4-1, and/or FR5, or may be within the EHF band. It is contemplated that the frequencies included in these operating bands (e.g., FR1, FR2, FR3, FR4, FR4-a, FR4-1, and/or FR5) may be modified, and techniques described herein are applicable to those modified frequency ranges.

As indicated above, FIG. 1 is provided as an example. Other examples may differ from what is described with regard to FIG. 1.

Figure 2:
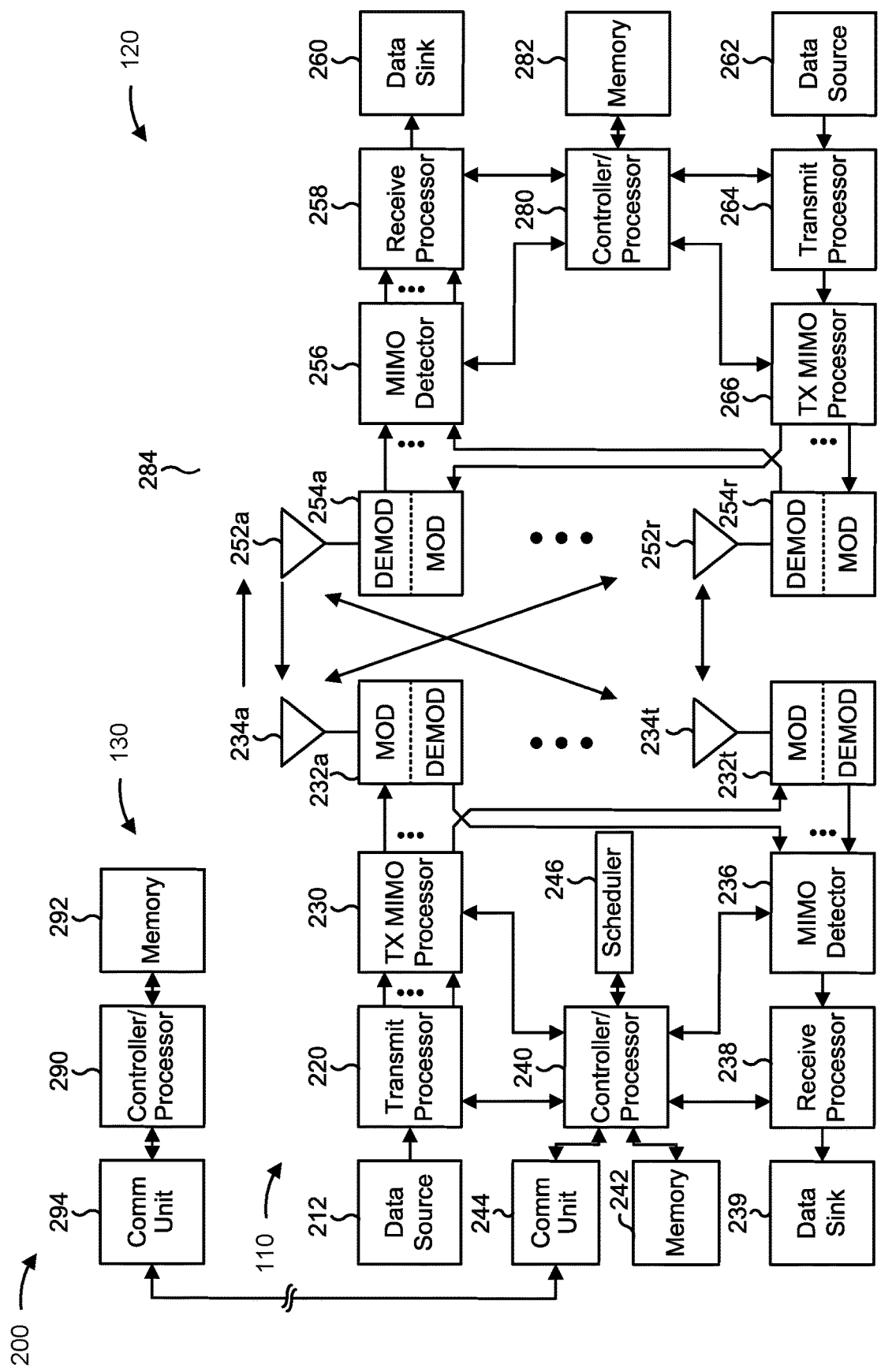
FIG. 2 is a diagram illustrating an example of a network node in communication with a user equipment (UE) in a wireless network, in accordance with the present disclosure.

FIG. 2 is a diagram illustrating an example 200 of a network node 110 in communication with a UE 120 in a wireless network 100, in accordance with the present disclosure. The network node 110 may be equipped with a set of antennas 234a through 234t, such as T antennas (T≥1). The UE 120 may be equipped with a set of antennas 252a through 252r, such as R antennas (R≥1). The network node 110 of example 200 includes one or more radio frequency components, such as antennas 234 and a modem 254. In some examples, a network node 110 may include an interface, a communication component, or another component that facilitates communication with the UE 120 or another network node. Some network nodes 110 may not include radio frequency components that facilitate direct communication with the UE 120, such as one or more CUs, or one or more DUs.

At the network node 110, a transmit processor 220 may receive data, from a data source 212, intended for the UE 120 (or a set of UEs 120). The transmit processor 220 may select one or more modulation and coding schemes (MCSs) for the UE 120 based at least in part on one or more channel quality indicators (CQIs) received from that UE 120. The network node 110 may process (e.g., encode and modulate) the data for the UE 120 based at least in part on the MCS(s) selected for the UE 120 and may provide data symbols for the UE 120. The transmit processor 220 may process system information (e.g., for semi-static resource partitioning information (SRPI)) and control information (e.g., CQI requests, grants, and/or upper layer signaling) and provide overhead symbols and control symbols. The transmit processor 220 may generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide a set of output symbol streams (e.g., T output symbol streams) to a corresponding set of modems 232 (e.g., T modems), shown as modems 232a through 232t. For example, each output symbol stream may be provided to a modulator component (shown as MOD) of a modem 232. Each modem 232 may use a respective modulator component to process a respective output symbol stream (e.g., for OFDM) to obtain an output sample stream. Each modem 232 may further use a respective modulator component to process (e.g., convert to analog, amplify, filter, and/or upconvert) the output sample stream to obtain a downlink signal. The modems 232a through 232t may transmit a set of downlink signals (e.g., T downlink signals) via a corresponding set of antennas 234 (e.g., T antennas), shown as antennas 234a through 234t.

At the UE 120, a set of antennas 252 (shown as antennas 252a through 252r) may receive the downlink signals from the network node 110 and/or other network nodes 110 and may provide a set of received signals (e.g., R received signals) to a set of modems 254 (e.g., R modems), shown as modems 254a through 254r. For example, each received signal may be provided to a demodulator component (shown as DEMOD) of a modem 254. Each modem 254 may use a respective demodulator component to condition (e.g., filter, amplify, downconvert, and/or digitize) a received signal to obtain input samples. Each modem 254 may use a demodulator component to further process the input samples (e.g., for OFDM) to obtain received symbols. A MIMO detector 256 may obtain received symbols from the modems 254, may perform MIMO detection on the received symbols if applicable, and may provide detected symbols. A receive processor 258 may process (e.g., demodulate and decode) the detected symbols, may provide decoded data for the UE 120 to a data sink 260, and may provide decoded control information and system information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, and/or a CQI parameter, among other examples. In some examples, one or more components of the UE 120 may be included in a housing 284.

The network controller 130 may include a communication unit 294, a controller/processor 290, and a memory 292. The network controller 130 may include, for example, one or more devices in a core network. The network controller 130 may communicate with the network node 110 via the communication unit 294.

One or more antennas (e.g., antennas 234a through 234t and/or antennas 252a through 252r) may include, or may be included within, one or more antenna panels, one or more antenna groups, one or more sets of antenna elements, and/or one or more antenna arrays, among other examples. An antenna panel, an antenna group, a set of antenna elements, and/or an antenna array may include one or more antenna elements (within a single housing or multiple housings), a set of coplanar antenna elements, a set of non-coplanar antenna elements, and/or one or more antenna elements coupled to one or more transmission and/or reception components, such as one or more components of FIG. 2.

On the uplink, at the UE 120, a transmit processor 264 may receive and process data from a data source 262 and control information (e.g., for reports that include RSRP, RSSI, RSRQ, and/or CQI) from the controller/processor 280. The transmit processor 264 may generate reference symbols for one or more reference signals. The symbols from the transmit processor 264 may be precoded by a TX MIMO processor 266 if applicable, further processed by the modems 254 (e.g., for DFT-s-OFDM or CP-OFDM), and transmitted to the network node 110. In some examples, the modem 254 of the UE 120 may include a modulator and a demodulator. In some examples, the UE 120 includes a transceiver. The transceiver may include any combination of the antenna(s) 252, the modem(s) 254, the MIMO detector 256, the receive processor 258, the transmit processor 264, and/or the TX MIMO processor 266. The transceiver may be used by a processor (e.g., the controller/processor 280) and the memory 282 to perform aspects of any of the methods described herein (e.g., with reference to FIGS. 5-9B).

At the network node 110, the uplink signals from UE 120 and/or other UEs may be received by the antennas 234, processed by the modem 232 (e.g., a demodulator component, shown as DEMOD, of the modem 232), detected by a MIMO detector 236 if applicable, and further processed by a receive processor 238 to obtain decoded data and control information sent by the UE 120. The receive processor 238 may provide the decoded data to a data sink 239 and provide the decoded control information to the controller/processor 240. The network node 110 may include a communication unit 244 and may communicate with the network controller 130 via the communication unit 244. The network node 110 may include a scheduler 246 to schedule one or more UEs 120 for downlink and/or uplink communications. In some examples, the modem 232 of the network node 110 may include a modulator and a demodulator. In some examples, the network node 110 includes a transceiver. The transceiver may include any combination of the antenna(s) 234, the modem(s) 232, the MIMO detector 236, the receive processor 238, the transmit processor 220, and/or the TX MIMO processor 230. The transceiver may be used by a processor (e.g., the controller/processor 240) and the memory 242 to perform aspects of any of the methods described herein (e.g., with reference to FIGS. 5-9B).

The controller/processor 240 of the network node 110, the controller/processor 280 of the UE 120, and/or any other component(s) of FIG. 2 may perform one or more techniques associated with adaptive digital pre-distortion kernels, as described in more detail elsewhere herein. For example, the controller/processor 240 of the network node 110, the controller/processor 280 of the UE 120, and/or any other component(s) of FIG. 2 may perform or direct operations of, for example, process 900 of FIGS. 9A and 9B and/or other processes as described herein. Alternatively or additionally, and as further described with regard to FIG. 3 and FIG. 5, the network node 110 and/or the UE 120 may include an adaptive DPD apparatus (e.g., an apparatus 702 as described with reference to FIG. 7) that performs or directs operations of the process 900. The memory 242 and the memory 282 may store data and program codes for the network node 110 and the UE 120, respectively. In some examples, the memory 242 and/or the memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the network node 110 and/or the UE 120, may cause the one or more processors, the UE 120, and/or the network node 110 to perform or direct operations of, for example, process 900 of FIGS. 9A and 9B, and/or other processes as described herein. In some examples, executing instructions may include running the instructions, converting the instructions, compiling the instructions, and/or interpreting the instructions, among other examples.

In some aspects, the apparatus 702 includes means for receiving an indication of a selected DPD kernel from a plurality of DPD kernels and/or means for storing, based at least in part on an envelope delay line component, an envelope value associated with a sample of an I/Q signal. In some aspects, the means for storing may include means for storing the envelope value as one of a plurality of envelope values that span a time duration, wherein the plurality of envelope values may be based at least in part on a plurality of samples associated with the I/Q signal. The apparatus 702 may include means for storing, based at least in part on a computation storage component, at least: a first computational value as one of a first plurality of computational values, the first plurality of computational values being based at least in part on the plurality of samples, the first computational value being based at least in part on a first computation applied to the sample; a second computational value as one of a second plurality of computational values, the second plurality of computational values being based at least in part on the plurality of samples, the second computational value being based at least in part on a second computation applied to the sample; and/or the plurality of samples. Alternatively or additionally, the apparatus 702 includes means for selecting a subset of envelope values from the plurality of envelope values based at least in part on the selected DPD kernel. In some aspects, the apparatus 702 includes means for generating, based at least in part on the subset of envelope values and at least one LUT component, an envelope computation value. The apparatus 702 may include means for selecting, based at least in part on the selected DPD kernel, at least one subset of computational values stored by the computation storage component, and/or means for generating an output sample that includes DPD (e.g., an output sample generated based at least in part on applying digital pre-distortion to an input sample) based at least in part on combining the envelope computation value with the at least one subset of computational values. In some aspects, the means for the apparatus to perform operations described herein may include, for example, one or more of: an envelope delay line components 710, an envelope selection component 712, an LUT component 714, an LUT selection component 716, one or more computation delay line components 718, one or more computation selection components 720 and/or 722, one or more combiner components 724 and/or 726, and/or one or more value selection components 728 as further described with regard to FIG. 7.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of the controller/processor 280.

As indicated above, FIG. 2 is provided as an example. Other examples may differ from what is described with regard to FIG. 2.

Figure 3:
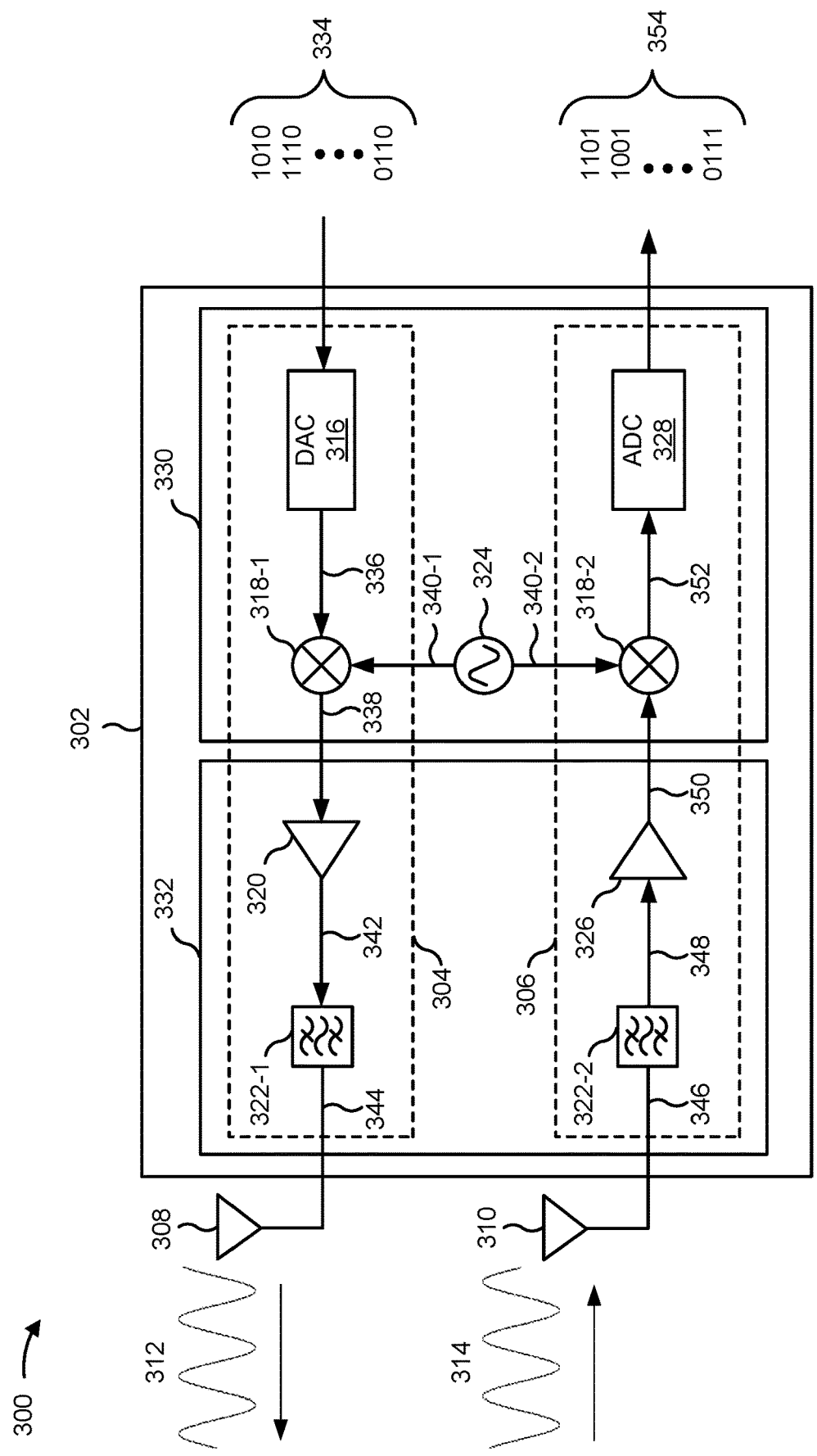
FIG. 3 is a diagram illustrating an example of a wireless transceiver that may be used by a device to communicate in a wireless network, in accordance with the present disclosure.

FIG. 3 is a diagram illustrating an example 300 of a wireless transceiver 302 that may be used by a device to communicate in a wireless network, in accordance with the present disclosure. In some aspects, the wireless transceiver 302 may include, or be included in, one or more components as described with regard to FIG. 2. To illustrate, one or more components of the wireless transceiver 302 may be coupled to, and/or included in, the modem 232 (e.g., one or more of the modems 232a through 232t) and or the modem 254 (e.g., one or more of the modems 254a through 254r).

A wireless transceiver 302 may include a transmitter 304 (shown with a dashed line) and/or a receiver 306 (shown with a dashed line). As shown by the example 300, the transmitter 304 may be coupled to at least a first antenna 308, and the receiver 306 may be coupled to at least a second antenna 310. However, in other examples, the transmitter 304 and the receiver 306 may be coupled to a same antenna through a switch and/or duplexer. In some aspects, the transmitter 304 may generate and transmit an outgoing RF signal 312, and the receiver 306 may receive and process an incoming RF signal 314.

As shown by the example 300, the transmitter 304 may include a digital-to-analog converter 316 (DAC 316), a first mixer 318-1, a first amplifier 320 (e.g., a power amplifier), and a first filter 322-1 (e.g., a surface-acoustic-wave (SAW) filter). The first mixer 318-1 may be coupled to a local oscillator (LO) 324. In some aspects, the DAC 316 may be coupled to an application processor or another processor associated with the wireless transceiver 302 (e.g., the modem 232 or the modem 254). Other examples of a transmitter may include multiple DACs, multiple mixers, multiple amplifiers, and/or multiple filters that are not shown by the example 300.

The receiver 306 may include a second filter 322-2 (e.g., a SAW filter), a second amplifier 326 (e.g., a low-noise amplifier), a second mixer 318-2, and an analog-to-digital converter 328 (ADC 328). The second mixer 318-2 may be coupled to the LO 324. Alternatively or additionally, the ADC 328 may be coupled to an application processor or another processor associated with the wireless transceiver 302 (e.g., the modem 232 or the modem 254). Other examples of a receiver may include multiple filters, multiple amplifiers, multiple mixers, and/or multiple ADCs that are not shown by the example 300.

In some aspects, the wireless transceiver 302 may be implemented using multiple circuits, such as multiple integrated circuits (ICs). To illustrate, the wireless transceiver 302 may include a transceiver circuit 330 and a radio-frequency front-end (RFFE) circuit 332. Accordingly, components used to form the transmitter 304 and the receiver 306 may be distributed across the multiple circuits. As one example, the transceiver circuit 330 and the RFFE circuit 332 may each include at least some components that form the transmitter 304 and/or at least some components that form the receiver 306. To illustrate, and with regard to the transmitter 304, the transceiver circuit 330 may include the DAC 316 and the first mixer 318-1 of the transmitter 304, and the RFFE circuit 332 may include the first amplifier 320 and the first filter 322-2 of the transmitter 304. Alternatively or additionally, and with regard to the receiver 306, the transceiver circuit 330 may include the second mixer 318-2 and the ADC 328 of the receiver 306, and the RFFE circuit 332 may include the second filter 322-2 and the second amplifier 326 of the receiver 306. In some aspects, the DAC 316 and/or the ADC 328 may be implemented on a circuit separate from the transceiver circuit 330, such as the modem 232 or the modem 254.

In some aspects, the transmitter 304 may generate the outgoing RF signal 312 based at least in part on one or more digital samples 334. A "digital sample", which may alternatively be referred to as a sample, may denote a representation of an analog signal, such as an amplitude representation of the analog signal at a point in time. Each sample of a set of samples that span a time duration may represent the analog signal at a different point in time within the time duration. To illustrate, a first sample may represent the signal at a first point in time, a second sample may represent the signal at a second, different point in time, up to an $n^{th}$ sample that may represent the signal at an $n^{th}$ point in time, where n is an integer and the points in time that span the time duration may be uniformly separated in time. In some aspects, a sample may capture an in-phase/quadrature (I/Q) signal. For example, a sample may include an in-phase component (I-component) value associated with the I/Q signal at the point in time and a quadrature component (Q-component) value at the point in time. A sample associated with an I/Q signal (e.g., that includes an I-component and a Q-component) may alternatively or additionally be referred to as a complex sample.

In some aspects, the DAC 316 may receive, as the digital sample(s) 334, one or more samples associated with a pre-upconversion signal (e.g., a baseband signal or an intermediate frequency (IF) signal). In some aspects, the DAC 316 may receive one or more samples that include digital pre-distortion (DPD) as further described with regard to FIG. 5. To illustrate, the DAC 316 may receive one or more samples from an adaptive DPD apparatus as further described with regard to FIG. 7. Using the digital sample(s) 334, the DAC 316 may generate, as an output, an analog pre-upconversion signal 336.

The first mixer 318-1 may receive the analog pre-upconversion signal 336 as input, and generate, as an output, a prefiltered upconverted signal 338 using an LO signal 340-1 provided by the LO 324. The prefiltered upconverted signal 338 may be an RF signal and/or may include some noise and/or unwanted frequencies, such as a harmonic frequency. The first amplifier 320 may receive the prefiltered upconverted signal 338 and generate an amplified prefiltered signal 342.

The first filter 322-2 may receive the amplified prefiltered signal 342 as input and filter the amplified pre-filter transmit signal 342 to generate a filtered transmit signal 344. As part of the filtering process, the first filter 322-2 may attenuate the noise or unwanted frequencies included in the prefiltered upconverted signal 338 and/or the amplified prefiltered signal 342. The transmitter 304 may provide the filtered transmit signal 344 to the first antenna 308 for transmission as the outgoing RF signal 312.

In some aspects, the receiver 306 may receive the incoming RF signal 314 using the second antenna 310. As shown by the example 300, the second antenna 310 may generate a prefiltered receive signal 346. The second antenna 310 may be coupled to the second filter 322-2 such that the second filter 322-2 receives and filters the prefiltered receive signal 346 to remove noise and/or unwanted frequencies. Accordingly, the second filter 322-2 may generate a filtered receive signal 348.

The second amplifier 326 may receive and amplify the filtered receive signal 348 to generate an amplified filtered receive signal 350. Based at least in part on being coupled to the second amplifier 326, the second mixer 318-2 may receive the amplified filtered receive signal 350 and downconvert the amplified filtered receive signal 350 using a LO signal 340-2 (e.g., from the LO 324) to generate a downconverted receive signal 352, which may be a baseband signal or an IF signal. The ADC 328 may receive the downconverted receive signal 352 and generate a digital signal by generating one or more digital samples 354 as output. The one or more digital samples 354 may be processed by a processor associated with the wireless transceiver 302 and/or another processor, such as a processor associated with the modem 232 or the modem 254.

As indicated above, FIG. 3 is provided as an example. Other examples may differ from what is described with regard to FIG. 3. As one example, the wireless transceiver 302 may include one or more feedback mechanisms, such as a feedback path (e.g., a feedback receiver) that provides feedback associated with an output from the first amplifier 320 to a DPD apparatus (e.g., an adaptive DPD apparatus as further described with regard to FIG. 7).

Deployment of communication systems, such as 5G NR systems, may be arranged in multiple manners with various components or constituent parts. In a 5G NR system, or network, a network node, a network entity, a mobility element of a network, a RAN node, a core network node, a network element, a base station, or a network equipment may be implemented in an aggregated or disaggregated architecture. For example, a base station (such as a Node B (NB), an evolved NB (eNB), an NR BS, a 5G NB, an access point (AP), a TRP, or a cell, among other examples), or one or more units (or one or more components) performing base station functionality, may be implemented as an aggregated base station (also known as a standalone base station or a monolithic base station) or a disaggregated base station. "Network entity" or "network node" may refer to a disaggregated base station, or to one or more units of a disaggregated base station (such as one or more CUs, one or more DUs, one or more RUs, or a combination thereof).

An aggregated base station (e.g., an aggregated network node) may be configured to utilize a radio protocol stack that is physically or logically integrated within a single RAN node (e.g., within a single device or unit). A disaggregated base station (e.g., a disaggregated network node) may be configured to utilize a protocol stack that is physically or logically distributed among two or more units (such as one or more CUs, one or more DUs, or one or more RUs). In some examples, a CU may be implemented within a network node, and one or more DUs may be co-located with the CU, or alternatively, may be geographically or virtually distributed throughout one or multiple other network nodes. The DUs may be implemented to communicate with one or more RUs. Each of the CU, DU and RU also can be implemented as virtual units, such as a virtual central unit (VCU), a virtual distributed unit (VDU), or a virtual radio unit (VRU), among other examples.

Base station-type operation or network design may consider aggregation characteristics of base station functionality. For example, disaggregated base stations may be utilized in an IAB network, an open radio access network (O-RAN (such as the network configuration sponsored by the O-RAN Alliance)), or a virtualized radio access network (vRAN, also known as a cloud radio access network (C-RAN)) to facilitate scaling of communication systems by separating base station functionality into one or more units that can be individually deployed. A disaggregated base station may include functionality implemented across two or more units at various physical locations, as well as functionality implemented for at least one unit virtually, which can enable flexibility in network design. The various units of the disaggregated base station can be configured for wired or wireless communication with at least one other unit of the disaggregated base station.

Figure 4:
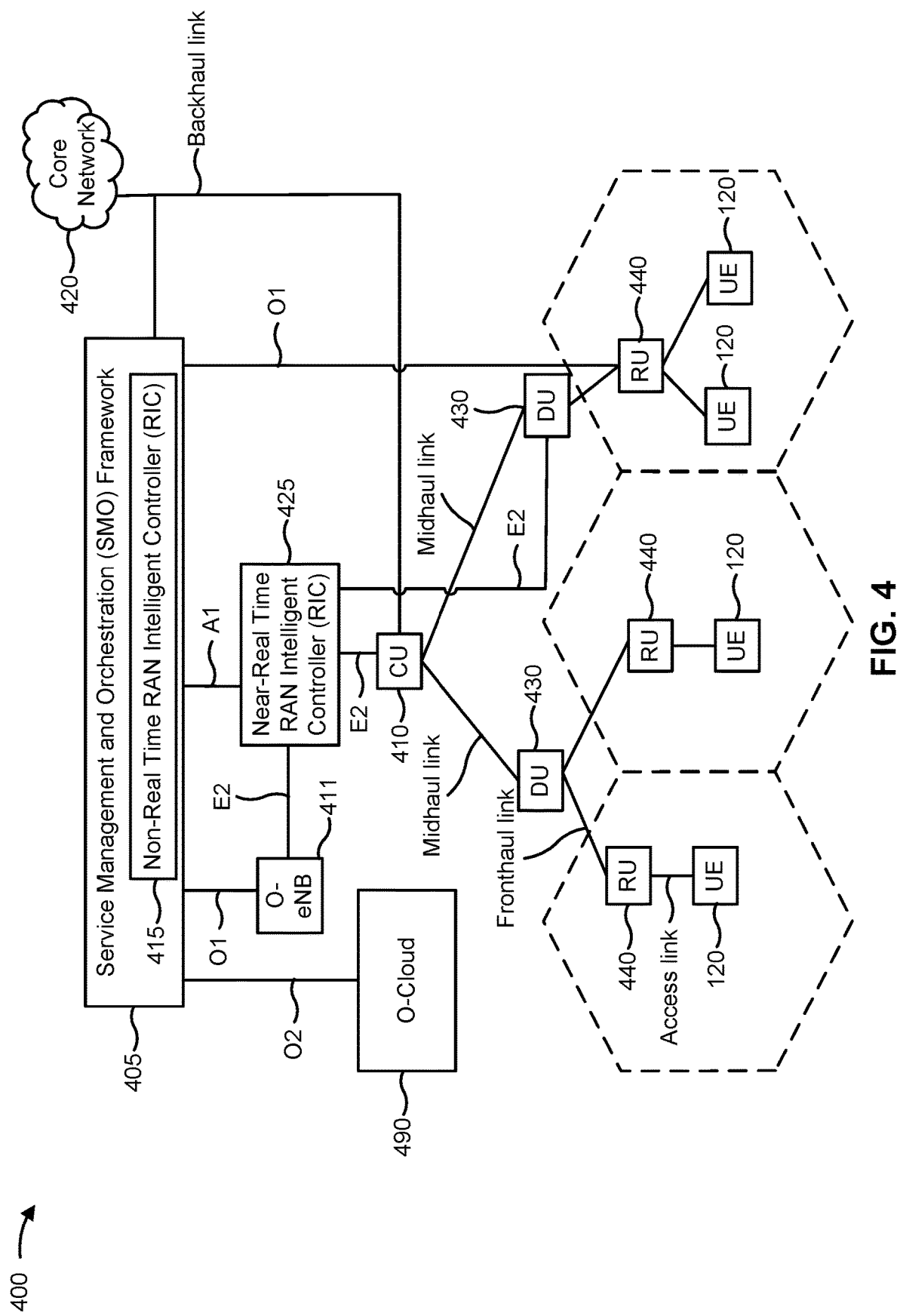
FIG. 4 is a diagram illustrating an example disaggregated base station architecture, in accordance with the present disclosure.

FIG. 4 is a diagram illustrating an example disaggregated base station architecture 400, in accordance with the present disclosure. The disaggregated base station architecture 400 may include a CU 410 that can communicate directly with a core network 420 via a backhaul link, or indirectly with the core network 420 through one or more disaggregated control units (such as a Near-RT RIC 425 via an E2 link, or a Non-RT RIC 415 associated with a Service Management and Orchestration (SMO) Framework 405, or both). A CU 410 may communicate with one or more DUs 430 via respective midhaul links, such as through F1 interfaces. Each of the DUs 430 may communicate with one or more RUs 440 via respective fronthaul links. Each of the RUs 440 may communicate with one or more UEs 120 via respective radio frequency (RF) access links. In some implementations, a UE 120 may be simultaneously served by multiple RUs 440.

Each of the units, including the CUs 410, the DUs 430, the RUs 440, as well as the Near-RT RICs 425, the Non-RT RICs 415, and the SMO Framework 405, may include one or more interfaces or be coupled with one or more interfaces configured to receive or transmit signals, data, or information (collectively, signals) via a wired or wireless transmission medium. Each of the units, or an associated processor or controller providing instructions to one or multiple communication interfaces of the respective unit, can be configured to communicate with one or more of the other units via the transmission medium. In some examples, each of the units can include a wired interface, configured to receive or transmit signals over a wired transmission medium to one or more of the other units, and a wireless interface, which may include a receiver, a transmitter or transceiver (such as an RF transceiver), configured to receive or transmit signals, or both, over a wireless transmission medium to one or more of the other units.

In some aspects, the CU 410 may host one or more higher layer control functions. Such control functions can include radio resource control (RRC) functions, packet data convergence protocol (PDCP) functions, or service data adaptation protocol (SDAP) functions, among other examples. Each control function can be implemented with an interface configured to communicate signals with other control functions hosted by the CU 410. The CU 410 may be configured to handle user plane functionality (for example, Central Unit-User Plane (CU-UP) functionality), control plane functionality (for example, Central Unit-Control Plane (CU-CP) functionality), or a combination thereof. In some implementations, the CU 410 can be logically split into one or more CU-UP units and one or more CU-CP units. A CU-UP unit can communicate bidirectionally with a CU-CP unit via an interface, such as the E1 interface when implemented in an O-RAN configuration. The CU 410 can be implemented to communicate with a DU 430, as necessary, for network control and signaling.

Each DU 430 may correspond to a logical unit that includes one or more base station functions to control the operation of one or more RUs 440. In some aspects, the DU 430 may host one or more of a radio link control (RLC) layer, a MAC layer, and one or more high physical (PHY) layers depending, at least in part, on a functional split, such as a functional split defined by the 3GPP. In some aspects, the one or more high PHY layers may be implemented by one or more modules for forward error correction (FEC) encoding and decoding, scrambling, and modulation and demodulation, among other examples. In some aspects, the DU 430 may further host one or more low PHY layers, such as implemented by one or more modules for a fast Fourier transform (FFT), an inverse FFT (iFFT), digital beamforming, or physical random access channel (PRACH) extraction and filtering, among other examples. Each layer (which also may be referred to as a module) can be implemented with an interface configured to communicate signals with other layers (and modules) hosted by the DU 430, or with the control functions hosted by the CU 410.

Each RU 440 may implement lower-layer functionality. In some deployments, an RU 440, controlled by a DU 430, may correspond to a logical node that hosts RF processing functions or low-PHY layer functions, such as performing an FFT, performing an iFFT, digital beamforming, or PRACH extraction and filtering, among other examples, based on a functional split (for example, a functional split defined by the 3GPP), such as a lower layer functional split. In such an architecture, each RU 440 can be operated to handle over the air (OTA) communication with one or more UEs 120. In some implementations, real-time and non-real-time aspects of control and user plane communication with the RU(s) 440 can be controlled by the corresponding DU 430. In some scenarios, this configuration can enable each DU 430 and the CU 410 to be implemented in a cloud-based RAN architecture, such as a vRAN architecture.

The SMO Framework 405 may be configured to support RAN deployment and provisioning of non-virtualized and virtualized network elements. For non-virtualized network elements, the SMO Framework 405 may be configured to support the deployment of dedicated physical resources for RAN coverage requirements, which may be managed via an operations and maintenance interface (such as an O1 interface). For virtualized network elements, the SMO Framework 405 may be configured to interact with a cloud computing platform (such as an open cloud (O-Cloud) platform 490) to perform network element life cycle management (such as to instantiate virtualized network elements) via a cloud computing platform interface (such as an O2 interface). Such virtualized network elements can include, but are not limited to, CUs 410, DUs 430, RUs 440, non-RT RICs 415, and Near-RT RICs 425. In some implementations, the SMO Framework 405 can communicate with a hardware aspect of a 4G RAN, such as an open eNB (O-eNB) 411, via an O1 interface. Additionally, in some implementations, the SMO Framework 405 can communicate directly with each of one or more RUs 440 via a respective O1 interface. The SMO Framework 405 also may include a Non-RT RIC 415 configured to support functionality of the SMO Framework 405.

The Non-RT RIC 415 may be configured to include a logical function that enables non-real-time control and optimization of RAN elements and resources, Artificial Intelligence/Machine Learning (AI/ML) workflows including model training and updates, or policy-based guidance of applications/features in the Near-RT RIC 425. The Non-RT RIC 415 may be coupled to or communicate with (such as via an A1 interface) the Near-RT RIC 425. The Near-RT RIC 425 may be configured to include a logical function that enables near-real-time control and optimization of RAN elements and resources via data collection and actions over an interface (such as via an E2 interface) connecting one or more CUs 410, one or more DUs 430, or both, as well as an O-eNB, with the Near-RT RIC 425.

In some implementations, to generate AI/ML models to be deployed in the Near-RT RIC 425, the Non-RT RIC 415 may receive parameters or external enrichment information from external servers. Such information may be utilized by the Near-RT RIC 425 and may be received at the SMO Framework 405 or the Non-RT RIC 415 from non-network data sources or from network functions. In some examples, the Non-RT RIC 415 or the Near-RT RIC 425 may be configured to tune RAN behavior or performance. For example, the Non-RT RIC 415 may monitor long-term trends and patterns for performance and employ AI/ML models to perform corrective actions through the SMO Framework 405 (such as reconfiguration via an O1 interface) or via creation of RAN management policies (such as A1 interface policies).

As indicated above, FIG. 4 is provided as an example. Other examples may differ from what is described with regard to FIG. 4.

Figure 5:
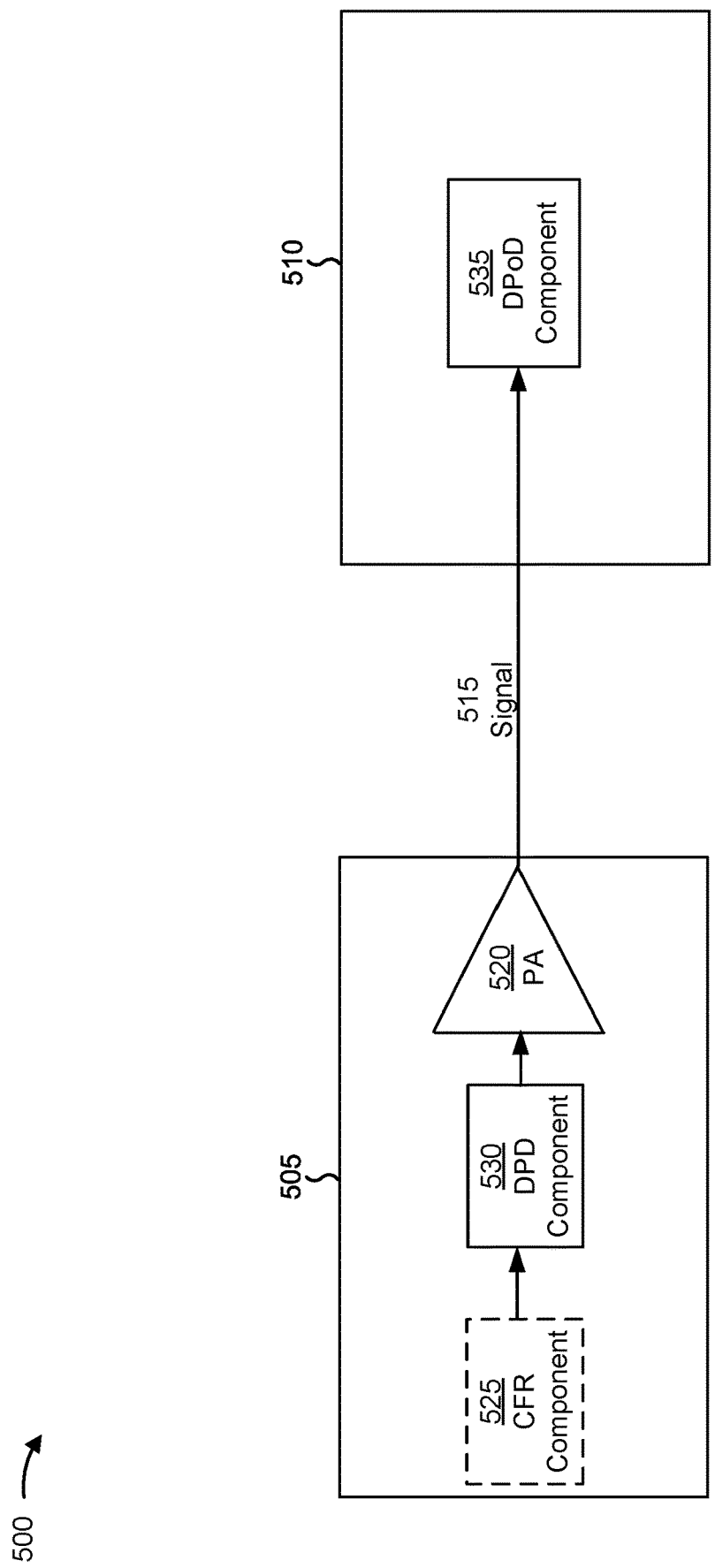
FIG. 5 is a diagram illustrating an example that includes a transmitter that may include digital pre-distortion (DPD) capabilities, and a receiver that may include digital post-distortion (DPoD) capabilities, in accordance with the present disclosure.

FIG. 5 is a diagram illustrating an example 500 that includes a transmitter 505 that may include digital pre-distortion (DPD) capabilities, and a receiver 510 that may include digital post-distortion (DPoD) capabilities, in accordance with the present disclosure. As shown in FIG. 5, the transmitter 505 may communicate with the receiver 510 using a wireless signal 515. In some aspects, a network node 110 (e.g., any network node described with regard to the disaggregated base station architecture 400) may include the transmitter 505 and UE 120 may include the receiver 510. Alternatively or additionally, the UE 120 may include the transmitter 505 and the network node 110 may include the receiver 510. The block diagrams associated with the transmitter 505 and with the receiver 510 shown by the example 500 have been simplified for discussion purposes. Other examples may include alternative or additional features that have been omitted for clarity. For example, the transmitter 505 may include one or more components of the transmitter 304 described with regard to FIG. 3. Alternatively or additionally, the transmitter 304 may include one or more components of the transmitter 505. As another example, the receiver 510 may include one or more components of the receiver 306 described with regard to FIG. 3 (or vice versa).

As shown by the example 500, the transmitter 505 may communicate with the receiver 510 based at least in part on transmitting the signal 515 to the receiver 510. The signal 515 may be pre-processed by the transmitter 505 to, among other benefits, reduce a power-back off value associated with transmission of the signal 515 to the receiver 510.

To illustrate, in some communications systems, the transmitter 505 may transmit signals with increasing nonlinearity based at least in part on power increases. For example, the transmitter 505 may include a power amplifier (PA) 520 (which, in some aspects, may be a high-power amplifier) with a limited dynamic range that may distort a transmitted signal as a result of a relatively high peak to average power ratio (PAPR). In some aspects, the PA 520 may be considered the first amplifier 320 as described with regard to FIG. 3. The nonlinear distortion may be an in-band distortion, which affects link performance in connection with mutual information and/or an error vector magnitude (EVM) amount, or an out-band distortion, which causes adjacent channel interference (ACI) and/or results in a high adjacent channel leakage ratio (ACLR) (e.g., the transmitted signal interferes with other signals on neighboring frequency bands, with the ACI and/or ACLR indicating how much the adjacent channel is polluted by a main transmission). To avoid nonlinearity distortions and accompanying interference, the transmitter 505 may apply a power back-off value to reduce transmit power, thereby reducing nonlinearity.

In some aspects, applying a power back-off value may result in reduced power efficiency (e.g., less available transmit power is used to transmit in a channel, thereby reducing range, signal to interference noise ratio, and/or the like). To illustrate, based at least in part on applying the power back-off value, the transmitter 505 may transmit the signal 515 with less power in channel and may dissipate more power as heat, which may result in reduced power efficiency. Accordingly, the transmitter 505 may use one or more pre-transmission signal processing techniques to reduce the power back-off value. For example, the transmitter may utilize crest factor reduction (CFR) processing and/or digital pre-distortion (DPD) processing. CFR processing may reduce the dynamic range of the signal, while DPD processing may reduce nonlinear distortion to less than a threshold level with a reduced level of power back-off, thereby increasing power efficiency relative to avoiding nonlinear distortion using only a power back-off. As shown in FIG. 5, the transmitter 505 may thus include a CFR component 525 for performing CFR processing to the signal 515 (e.g., to reduce PAPR in the signal 515 as much as possible and thus reduce the power back-off value). While the transmitter 505 shown by FIG. 5 includes the CFR component 525, other transmitter implementations may exclude the CFR component 525, further indicated through the use of a dashed line. Alternatively or additionally, the transmitter 505 may include a DPD component 530 for performing DPD processing to the signal 515 (e.g., to linearize the power amplifier's response). As one example, the DPD component 530 may perform DPD processing on a digital signal such that the digital sample(s) 334 of FIG. 3 have been modified to include DPD. To illustrate, the transmitter 304 as described with regard to FIG. 3 may include the DPD component 530 prior to the DAC 316.

However, CFR processing consumes additional resources (e.g., bandwidth resources, power resources, computational resources, or the like), and, in some cases, CFR processing may introduce in-band distortion (e.g., EVM distortion) and/or out-band distortion (e.g., ACI distortion). Moreover, although DPD processing may correct an in-dynamic-range nonlinearity effect, nonlinearity may still cause a clipping effect (e.g., resulting from the limited dynamic range). Thus, the effectiveness and/or power efficiency benefit of CFR processing and DPD processing are limited.

To account for limitations of CFR and/or DPD processing, the receiver 510 may apply DPoD processing to the signal 515. DPoD processing may be similar to DPD processing but is performed in the receiver 510 rather than in the transmitter 505, and may be directed to processing for only EVM instead of processing for both EVM and AC. More particularly, DPoD processing may be performed by a DPoD component 535 at the receiver 510, which may include hardware and/or software configured to implement an algorithm configured to remove nonlinear noise that is generated by a known model (e.g., PA clipping). DPoD processing thus may allow for reduced power back-out values and greater power efficiency.

Different RATs may utilize different frequency bands and/or have different performance requirements. As one example, a first communication standard associated with LTE may specify to use a first carrier frequency, a first bandwidth, and/or a first power level for an LTE communication that is different from a second carrier frequency, a second bandwidth, and/or a second power level specified by a second communication standard associated with 5G. Accordingly, a device may transmit an LTE communication using a first, lower carrier frequency relative to a second, higher carrier frequency associated with transmitting a 5G communication. Alternatively or additionally, the device may transmit the LTE communication based at least in part on a first power level, a first frequency band, and/or a first bandwidth that is different from a second power level, second frequency band, and/or second bandwidth associated with transmitting the 5G communication. In some aspects, the device may transmit the LTE communication based at least in part on complying with a first error vector magnitude (EVM) requirement and/or a first adjacent channel leakage ratio (ACLR) requirement (e.g., specified by an LTE communication standard) that is different from a second EVM requirement and/or a second ACLR requirement associated with transmitting the 5G communication.

The differences in carrier frequencies, frequency bands, bandwidths, and/or power levels may affect how a PA distorts a signal. For example, a first signal that has a first bandwidth that is amplified by the PA may incur different distortion relative to a second signal amplified by the same PA, where the second signal has a second, different bandwidth (e.g., wider or narrower than the first bandwidth). In some wireless communication devices, the DPD processing performed by a DPD component may implement a single DPD algorithm and/or a single DPD kernel. That is, the DPD component may not switch between DPD algorithms or kernels. The single DPD algorithm and/or DPD kernel may result in inaccuracies in the DPD applied to some signals varying signal parameters. To illustrate, the single DPD algorithm and/or DPD kernel may model, to within an accuracy threshold, PA distortion associated with a PA and/or an inverse of the PA distortion (e.g., inverse PA distortion for correction) for a first signal at a first carrier frequency with a first bandwidth. However, the single DPD algorithm and/or DPD kernel may fail to model, to within the accuracy threshold, the PA distortion (and/or inverse PA distortion) for a second signal at a second, different carrier frequency with a second, different bandwidth. Alternatively or additionally, different PAs may introduce different non-linear distortion such that the single DPD algorithm and/or DPD kernel may fail to mitigate, to within the accuracy threshold, PA distortion and/or inverse PA distortion for some PAs. A "DPD kernel" may denote a core processing algorithm that performs digital pre-distortion processing using a single DPD algorithm. For example, an architecture associated with the DPD kernel and/or computations performed by the DPD kernel may be based at least in part on the single DPD algorithm.

Failure to mitigate, to within the accuracy threshold, the distortion introduced by a PA may result in a device failing to meet a performance requirement for a transmission. Alternatively or additionally, failing to meet the performance requirement may introduce errors into a transmitted signal and/or an observed signal at a receiver. For example, failure to mitigate the distortion to within the accuracy threshold may result in (unmitigated) PA noise that causes increased recovery errors at a receiver and/or a clipped signal that causes recovery errors at the receiver. In some aspects, failure to mitigate the distortion to within the accuracy threshold may result in interference to other signals in a wireless network, and result in increased recovery errors at other devices. Increased recovery errors may reduce data throughput, increase resource consumption, and/or increase data transfer latencies in the wireless network.

Some techniques and apparatuses described herein provide adaptive digital pre-distortion kernels. In some aspect, an apparatus (e.g., an adaptive DPD apparatus) may include hardware that implements multiple DPD kernels based at least in part on a generalized DPD kernel as further described below. A "generalized DPD kernel" may denote a configurable DPD kernel that may implement different DPD kernels using a single architecture by modifying one or more characteristics associated with the generalized DPD kernel, such as a timing advance characteristic of an envelope value used by the generalized DPD kernel, a timing delay characteristic of an envelope value used by the generalized DPD kernel, and/or a series summation computation used by the generalized DPD kernel.

An adaptive DPD apparatus may enable a transmitting device to dynamically change a DPD kernel used to apply digital pre-distortion to an input signal. As a frequency bandwidth, a carrier frequency, and/or a power level of an input signal changes, a transmitting device may select a DPD kernel (e.g., without changing hardware and using an adaptive DPD apparatus) that models the behavior of the non-linearity of the distortion, the non-linearity of the inverse of the distortion, and/or the non-linearity of pre-distortion associated with mitigating the distortion to within an accuracy threshold. Alternatively or additionally, the transmitting device may select a DPD kernel based at least in part on a type of PA (e.g., a Doherty power amplifier, a laterally-diffused metal-oxide semiconductor (LDMOS) power amplifier, and/or a gallium nitride (GaN) power amplifier) being used to process the input signal. To illustrate, the transmitting device may select the DPD kernel based at least in part on a non-linear distortion associated with the type of PA being used to process the input signal (and/or the pre-distortion applied by the DPD kernel to mitigate the PA distortion).

The ability to change DPD kernels improves how a transmitting device mitigates PA distortion in a signal relative to using other DPD kernels. To illustrate, the transmitting device may switch from using a first DPD kernel that fails to mitigate the PA distortion within the accuracy threshold to using a second DPD kernel that mitigates the PA distortion within the accuracy threshold (e.g., by selecting a DPD kernel that better models the behavior of the PA distortion, the inverse PA distortion, and/or pre-distortion that mitigates the PA distortion). Mitigating PA distortion to within the accuracy threshold enables a device to meet a performance requirement, reduce recovery errors at a receiver, improve data throughput, and/or improve data-transfer latencies. An adaptive DPD apparatus enables the device to mitigate PA distortion associated with a variety of transmission configurations and/or a variety of PA types using same hardware. Using the same hardware (e.g., the single, adaptable DPD apparatus) may simplify a hardware design of the transmitting device, reduce costs of building the transmitting device, and/or reduce testing time and costs.

As indicated above, FIG. 5 is provided as an example. Other examples may differ from what is described above.

In some aspects, a Volterra-based DPD kernel may be based at least in part on a generalized memory polynomial (GMP) series and/or a dynamic deviation reduction (DDR) series that models the behavior of the non-linear distortion associated with a PA and/or the non-linear pre-distortion that mitigates the non-linear distortion of the PA. Collectively, a GMP series and/or a DDR series may be referred to as a generalized DDR (GDDR) series. Based at least in part on one or more mathematical substitutions associated with assumptions about the non-linear system modeled by the series, a first generalized DDR (GDDR1) series may be represented as at least one of:

$$\text{GDDR1 Type 1: } y_n = \Sigma_{m \in M_1} \Sigma_{l \in L_1} \Sigma_{k \in K_1} c_{mlk} x_{n-m} |x_{n-l}|^{k-1} \quad (1)$$

or $$\text{GDDR1 Type 2: } y_n = \Sigma_{m \in M_2} \Sigma_{l \in L_2} \Sigma_{k \in K_2} c_{mlk} x_{n-m} * x_n^2 |x_{n-l}|^{k-3} \quad (2)$$

where $x_n$ represents an $n^{th}$ input sample (e.g., of a signal without pre-distortion applied), $y_n$ represents an $n^{th}$ output sample (e.g., of a signal with pre-distortion applied), $M_1$ and $M_2$ each represent a respective memory depth or length (e.g., a time duration) of the respective series and/or model, $L_1$ and $L_2$ each represents a respective lagging (e.g., a time lag) cross term index of the respective series and/or model, $K_1$ and $K_2$ each represent a respective nonlinearity order associated with the respective series and/or model, and $c_{mlk}$ represents a coefficient value, where k, l, m, and n are integers.

In a similar manner, and based at least in part on one or more mathematical substitutions associated with assumptions about the non-linear system modeled by the series, a second generalized DDR (GDDR2) series may be represented as at least one of:

$$\text{GDDR2 Type 1: } y_n = \Sigma_{m \in M_3} \Sigma_{l \in L_3} \Sigma_{k \in K_3} c_{mlk} x_{n-m}^2 x_n * |x_{n-l}|^{k-3} \quad (3)$$

or $$\text{GDDR2 Type 2: } y_n = \Sigma_{m \in M_4} \Sigma_{l \in L_4} \Sigma_{k \in K_4} c_{mlk} |x_{n-m}|^2 x_n |x_{n-l}|^{k-3} \quad (4)$$

or $$\text{GDDR2 Type 3: } y_n = \Sigma_{m \in M_5} \Sigma_{l \in L_5} \Sigma_{k \in K_5} c_{mlk} x_{n-m}^2 x_n^3 |x_{n-l}|^{k-5} \quad (5)$$

where $x_n$ represents an $n^{th}$ input sample, $y_n$ represents an $n^{th}$ output sample, $M_3$, $M_4$, and $M_5$ each represent a respective memory depth or length of the respective series and/or model, $L_3$, $L_4$, and $L_5$ each represent a respective lagging (e.g., a time lag) cross term index, $K_3$, $K_4$, and $K_5$, each represent a nonlinearity order of the respective series and/or model, and $c_{mlk}$ represents a coefficient value, where k, l, m, and n are integers.

Based at least in part on one or more mathematical substitutions associated with assumptions about the non-linear system modeled by the series, a third generalized DDR (GDDR3) series may be represented as at least one of:

$$\text{GDDR3 Type 1: } y_n = \Sigma_{m \in M_6} \Sigma_{l \in L_6} \Sigma_{k \in K_6} c_{mlk} |x_{n-m}|^2 x_{n-m} |x_{n-l}|^{k-5} \quad (6)$$

or $$\text{GDDR3 Type 2: } y_n = \Sigma_{m \in M_7} \Sigma_{l \in L_7} \Sigma_{k \in K_7} c_{mlk} x_{n-m}^3 x_2 *^2 |x_{n-l}|^{k-5} \quad (7)$$

or $$\text{GDDR3 Type 3: } y_n = \Sigma_{m \in M_8} \Sigma_{l \in L_8} \Sigma_{k \in K_8} c_{mlk} |x_{n-m}|^2 x_{n-m} * x_n^2 |x_{n-l}|^{k-5} \quad (8)$$

where $x_n$ represents an $n^{th}$ input sample, $y_n$ represents an $n^{th}$ output, $M_6$, $M_7$, and $M_8$ each represent a respective memory depth or length of the respective series and/or model, $L_6$, $L_7$, and $L_8$ each represent a respective lagging (e.g., a time lag) cross term index, $K_6$, $K_7$, and $K_8$, each represent a nonlinearity order of the respective series and/or model, and $c_{mlk}$ represents a coefficient value, where k, l, m, and n are integers.

The series and/or models shown by the equations (1)-(8) may be simplified and, collectively, represented as:

$$y_n = q_{n-j} \Sigma_{m \in M} p_{n-m} \Sigma_{l \in L} \Sigma_{k \in K} c_{jmlk} |x_{n-l}|^k \quad (9)$$

where $x_n$ represents an $n^{th}$ input sample, $y_n$ represents an $n^{th}$ output, k represents the power of the envelope, j, l, and m represent a lead or lag (e.g., a timing advance or a timing delay) relative to n, and c is a coefficient. In some aspects, j may be equal to "0". Each of equations (1)-(8) may be derived from the equation (9) based at least in part on using, as q and p, respectively, a computation and/or value associated with a sample (e.g., l, a sample value, a complex conjugate computation, an absolute value computation, a squared computation, a complex conjugate squared computation, an absolute value squared computation, a complex conjugate cubed computation, an absolute value squared multiplied by the sample computation, and/or an absolute value squared multiplied by a complex conjugate) from a set of computations defined as:

$$\{1, x_m, x_m*, |x_m|, x_m^2, x_m*^2, |x_m|^2, x_m^3, x_m*^3, |x_m|^2 x_m,$$
$$|x_m|^2 x_m*\} \quad (10)$$

Figure 7:
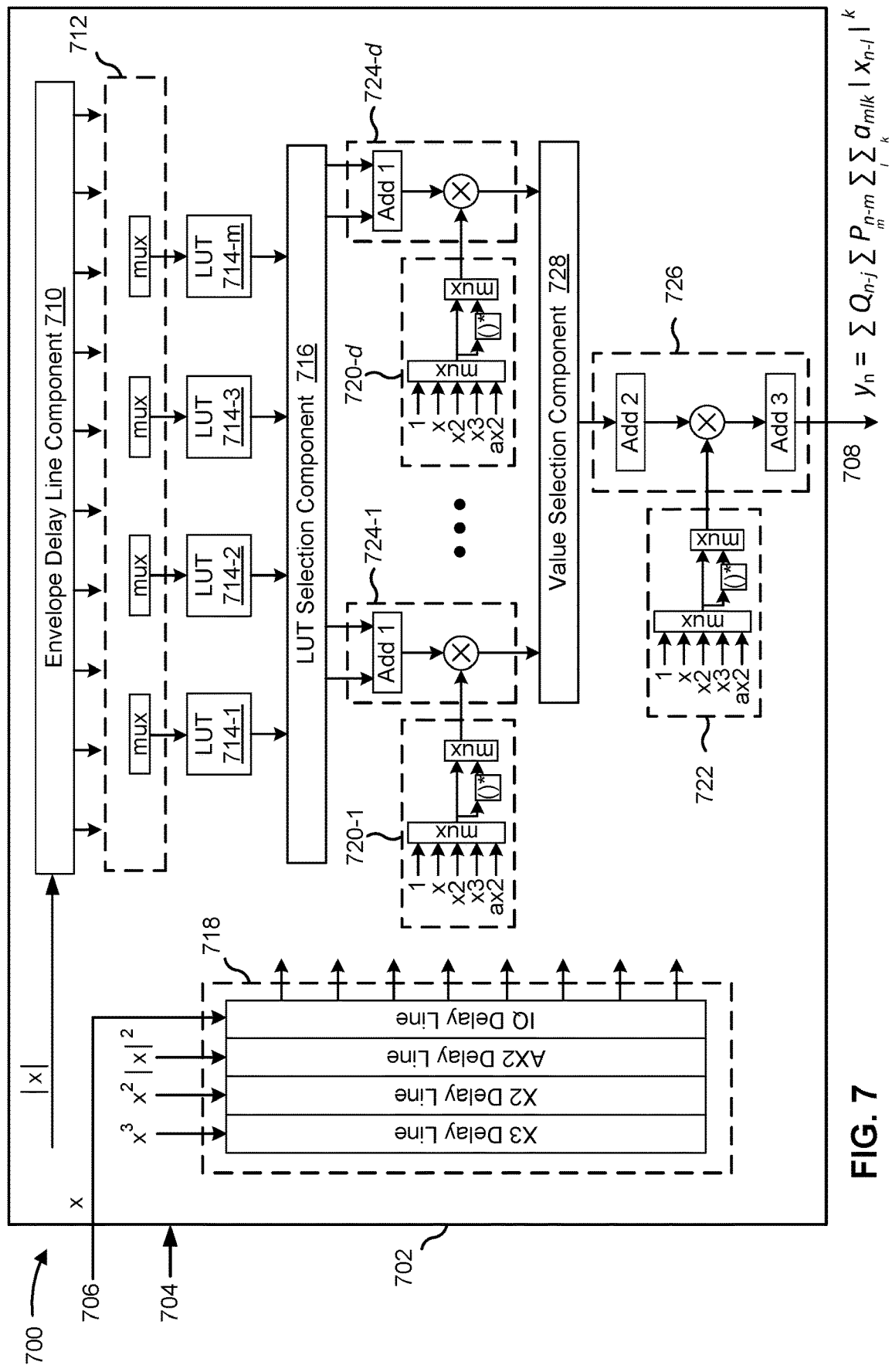
FIG. 7 is a diagram illustrating an example of an adaptive DPD apparatus, in accordance with the present disclosure.

As further described with regard to FIG. 7, a LUT may store an envelope computation value associated with the equation (9), such as an envelope power summation value. For example, the LUT may store an envelope power summation value and/or an approximation of the envelope power summation value that approximates the calculation $\Sigma_{k \in K} c_{jmlk} |x_{n-l}|^k$ of equation (9).

As shown by equation (11) below, an output sample (e.g., $y_n$) generated by a DPD kernel may be represented as a sum of different kernels:

$$y_n = \Sigma_{qj \in Q} q_{n-j} \Sigma_{pm \in M_q} p_{n-m} \Sigma_{l \in L_q} \Sigma_{k \in K_q} c_{jmlk} |x_{n-l}|^k \quad (11)$$

where $y_n$ represents the output sample at index n, Q represents a set of different types of computations that may be used as q (e.g., and associated delays or advances), M represents a set of different types of computations that may be used asp (e.g., and associated delays or advances), c represents a coefficient, $x_n$ represents an input sample at index n, L represents a set of computations (e.g., associated delays or advances) utilized based at least in part on an implemented q, and K represents a set of computations that may be utilized based at least in part on the implemented q. To illustrate, the different computation(s) and/or value(s) used may be based at least in part on which equation of the equations (1)-(8) is mapped to the equation (11). Based at least in part on using an LUT, equation (11) may be represented as:

$$\Sigma_{qj \in Q} q_{n-j} \Sigma_{pm \in M_q} p_{n-m} \Sigma_{l \in L_q} \text{LUT}_{jml}(|x_l|) \quad (12)$$

FIG. 6 is a diagram illustrating an example 600 of a table 602 that specifies computations and/or values (e.g., associated with a sample x) that may be used in a generalized DPD kernel, in accordance with the present disclosure. As shown by the example 600, the table 602 maps each equation of the equations (1)-(8) to the equation (11) by mapping one or more computations to $q_j$ and $p_m$. The table 602 includes a first column 604 that indicates any one of the equations (1)-(8), a second column 606 that indicates a first computation associated with $q_j$, and a third column 608 that indicates a second computation associated with $p_m$. The computations specified by the second column 606 and the third column 608 may include a constant value and/or a sample value (e.g., computations that may be realized without performing a computation).

As one example, row 610 of table 602 may be associated with the equation (1) as described above. In some aspects, the equation (1) may be represented by the equation (12) by using a constant value (e.g., 1) for $q_j$ as indicated by the second column 606 and a sample multiplied by 1 computation (e.g., $x_m$) for $p_m$ as indicated by the third column 608. As another example, row 612 of table 602 may be associated with the equation (8). The equation (8) may be represented by the equation (11) by squaring $x_0$ (e.g., $x_0^2$) for $q_j$ as indicated by the second column 606 and using an absolute value squared multiplied by a complex conjugate computation (e.g., $|x_m|^2 x_m^*$) for $p_m$ as indicated by the third column 608.

In some aspects, alternate or additional Volterra-based DPD kernels series different from the GMP and GDDR categories described above may be mapped to the equation (11) as generally shown by reference number 614. As non-limiting examples, the equation (11) may be mapped to a memory polynomial (MP) series and/or a DDR series. However, other DPD kernels not described herein may also be represented by equation (11) based at least in part on using a first computation (or constant) for $p_m$, a second computation (or constant) for $q_j$, and/or an approximate value stored in a LUT component based at least in part on a series associated with the DPD kernel.

As indicated above, FIG. 6 is provided as an example. Other examples may differ from what is described above.

In some aspects, a DPD kernel may be based at least in part on a decomposed vector rotation (DVR) series that models the behavior of non-linear distortion associated with a PA (and/or the non-linear pre-distortion that mitigates the non-linear distortion of the PA) based at least in part on a piece-wise linear function that is based at least in part on an envelope of a signal (e.g., a piece-wise linear envelope function). To illustrate, a first order basis DVR series may be represented as:

$$y_n = \Sigma_{m \in M} e^{j \angle x_{n-m}} \Sigma_{k \in K} c_{mk} ||x_{n-m}| - \beta_k| \quad (13)$$

where $x_n$ represents an $n^{th}$ input sample, $y_n$ represents an $n^{th}$ output sample, M represents a memory depth or length of the respective series, K represents a resolution of the piece-wise linear function, $\beta_k$ represents a boundary of the piece-wise linear envelope function, and $c_{mk}$ represents a coefficient value, where k and m are integers. By making a substitution of:

$$e^{j \angle x_{n-m}} = \frac{x_{n-m}}{|x_{n-m}|} \quad (14)$$

The first order basis DVR series may be represented as:

$$y_n = \sum_{m \in M} x_{n-m} \sum_{k \in K} c_{mk} \frac{||x_{n-m}| - \beta_k|}{|x_{n-m}|} \quad (15)$$

As further described below with regard to FIG. 7, a LUT may store an envelope computation value associated with the equation (15). For example, the LUT may store an envelope computation value and/or an approximation of the envelope computation value that approximates the calculation $$\sum_{k \in K} c_{mk} \frac{||x_{n-m}| - \beta_k|}{|x_{n-m}|}$$

of the equation (15).

As another example, a first order basis DVR series may represented as:

$$y_n = \sum_{m \in M} x_{n-m} \sum_{k \in K} c_{mk} \frac{||x_{n-m}| - \beta_k| + |x_{n-m}| - \beta_k}{2|x_{n-m}|} \quad (16)$$

As further described with regard to FIG. 7, an LUT may store an envelope computation value associated with the equation (16). For example, an LUT may store an envelope computation value and/or an approximation of the envelope computation value that approximates the calculation $$\sum_{k \in K} c_{mk} \frac{||x_{n-m}| - \beta_k| + |x_{n-m}| - \beta_k}{2|x_{n-m}|}$$

of the equation (16).

As another example, a second order basis DVR series may be represented as at least one of:

$$y_n = |x_n| \sum_{m \in M} x_{n-m} \sum_{k \in K} c_{mk} \frac{||x_{n-m}| - \beta_k|}{|x_{n-m}|} \quad (17)$$

or $$y_n = |x_n| \sum_{m \in M} x_{n-m} \sum_{k \in K} c_{mk} \frac{||x_{n-m}| - \beta_k| + |x_{n-m}| - \beta_k}{|x_{n-m}|} \quad (18)$$

As further described with regard to FIG. 7, a LUT may store an envelope computation value associated with the equation (17) and/or the equation (18). For example, the LUT may store an envelope power summation value and/or an approximation of the envelope power summation value that approximates the calculation $$\sum_{k \in K} c_{mk} \frac{||x_{n-m}| - \beta_k|}{|x_{n-m}|}$$

of the equation (17) and/or $$\sum_{k \in K} c_{mk} \frac{||x_{n-m}| - \beta_k| + |x_{n-m}| - \beta_k}{|x_{n-m}|}$$

of the equation (18).

In some aspects, a DVR series maybe represented as:

$$y_n = \Sigma_{m \in M} x_{n-m} \Sigma_{l \in L} \Sigma_{k \in K} c_{mlk} ||x_{n-l}| - \beta_k| \quad (19)$$

As further described with regard to FIG. 7, a LUT may store an envelope computation value associated with the equation (19). For example, the LUT may store an envelope computation value and/or an approximation of the envelope computation value that approximates the calculation $\Sigma_{k \in K} c_{mlk}||x_{n-l}| - \beta_k|$ of the equation (19).

The DVR series described with regard to equations (13), (15), (16), (17), (18), and (19), as well as other DVR series not described above, may be represented as:

$$y_n = \sum_{q_j \in Q} q_{n-j} \sum_{p_m \in M_q} p_{n-m} \sum_{l \in L_q} \sum_{k \in K_q} c_{jmlk}||x_{n-l}| - \beta_k| \quad (20)$$

or $$y_n = \sum_{q_j \in Q} q_{n-j} \sum_{p_m \in M_q} p_{n-m} \sum_{l \in L_q} \sum_{k \in K_q} c_{jmlk} \frac{||x_{n-l}| - \beta_k|}{|x_{n-l}|} \quad (21)$$

where a LUT may store an envelope computation value and/or an approximation of the envelope computation value associated with the computation $\Sigma_{k \in K} c_{jmlk}||x_{n-l}| - \beta_k|$ associated with equation (20) or $$\sum_{k \in K_q} c_{jmlk} \frac{||x_{n-l}| - \beta_k|}{|x_{n-l}|}$$

associated with the equation (21), which may be used to represent a computation performed by a particular DVR series as described above (e.g., a first LUT may store a first set of envelope computation values based at least in part on equation (13), a second LUT may store a second set of envelope computation values based at least in part on the equation (17), and/or a third LUT may store a third set of envelope computation values based at least in part on the equation (19)). Accordingly, a q value for a DVR series may be based at least in part on the computation $x^2$ and a p value for the DVR series may be based at least in part on the computation $x_{n-m}^*$ such that equation (20) may be further represented as:

$$\sum_{q_j \in Q} q_{n-j} \sum_{p_m \in M_q} p_{n-m} \sum_{l \in L_q} LUT_{jml}(|x_l|) \quad (22)$$

The ability to model a non-linear system (e.g., distortion and/or pre-distortion) using a series, such as any combination of a Volterra series, a DVR series, a GMP series, an MP series, and/or a DDR series, may enable a transmitting device to mitigate distortion by applying pre-distortion to an input signal and mitigate recovery errors at a receiving device. To illustrate, and as further described above, a Volterra series, a DVR series, a GMP series, a MP series, and/or a DDR series may be computed based at least in part on equation (21) by using a q and p computation associated with the respective series as described above and an LUT that stores an envelope computation value associated with the respective series. Because a first model may represent the non-linear system more accurately relative to a second model, the ability to change models, such as by way of an adaptive DPD apparatus, improves how a transmitting device mitigates PA distortion in a signal, resulting in an improved signal quality. The improved signal quality reduces recovery errors at a receiver, improves data throughput in a wireless network, and/or reduces data-transfer latencies in the wireless network relative to other signal qualities.

FIG. 7 is a diagram illustrating an example 700 of an adaptive DPD apparatus 702, in accordance with the present disclosure. In some aspects, the adaptive DPD apparatus may be implemented using one or more integrated circuits (ICs) and/or one or more System-on-Chips (SoCs) as further described below. The adaptive DPD apparatus 702 may be included in (and/or coupled to) a wireless transceiver of a network node (e.g., the network node 110 described with regard to FIG. 1 and/or any network node described with regard to the disaggregated base station architecture 400) and/or a UE (e.g., the UE 120 as described with regard to FIG. 1).

As shown by the example 700, the adaptive DPD apparatus 702 includes a first input mechanism 704 configured to receive an indication of a selected DPD kernel. As one example, the first input mechanism 704 may include one or more input lines connected to an input of an IC and/or SoC, such as a pin. In some aspects, the first input mechanism 704 may include a receive logic circuit (e.g., digital logic) and/or a clock to receive one or more bits serially and/or in parallel via the one or more input lines. Alternatively or additionally, the adaptive DPD apparatus may include a mapping logic circuit that maps the one or more bits to an index value and/or an identifier (ID) associated with one of multiple DPD kernels supported and/or implemented by the adaptive DPD apparatus 702. The first input mechanism 704 is coupled to one or more communication circuits included in the adaptive DPD apparatus 702, where a communication circuit communicates and/or forwards an indication of the selected DPD kernel to one or more configurable components as further described below.

The adaptive DPD apparatus 702 includes a second input mechanism 706 configured to receive a sample (e.g., a digital sample) of a signal. For example, the second input mechanism 706 may include one or more input lines that are used to receive a complex sample x associated with an I/Q signal (shown in FIG. 7 as "x"). In some aspects, the second input mechanism 706 may be coupled to one or more computational circuits (not shown in FIG. 7) that are implemented, at least in part, using digital logic, such as an adder circuit, a subtraction circuit, a multiplier circuit, and/or a division circuit. As one example, the second input mechanism 706 may be coupled to a first computational circuit that generates an envelope value (e.g., an absolute value) based at least in part on the received sample (shown in FIG. 7 as "|x|"), a second computational circuit that generates a cubed value based at least in part on the received sample (shown in FIG. 7 as "$x^3$"), a third computational circuit that generates a squared value based at least in part on the received sample (shown in FIG. 7 as "$x^2$"), and/or a fourth computational circuit that generates an absolute value squared value based at least in part on the received sample (shown in FIG. 7 as "$|x|^2$"). Other examples of computational circuits may include logic that generates a complex conjugate computation value, a complex conjugate squared computation value, an absolute value squared computation value, a complex conjugate cubed computation value, an absolute value squared multiplied by the sample computation value, and/or an absolute value squared multiplied by a complex conjugate value. In some aspects, the computational circuits may store values without performing a computation, such as a "1" value or a sample value.

In some aspects, the adaptive DPD apparatus 702 is configured to receive, by way of the first input mechanism 704, a computation indication that specifies one or more computational circuits to enable and/or disable, such as an indication to enable a complex conjugate computation circuit, an indication to disable an absolute value squared computation circuit, and/or an indication to enable a constant value (e.g., 1). Accordingly, the computation values generated and/or stored by the adaptive DPD apparatus 702 may be configurable by way of the first input mechanism 704 and/or the one or more computational circuits.

As shown by the example 700, the adaptive DPD apparatus 702 includes an output mechanism 708 configured to output one or more modified samples (e.g., an input sample x modified with pre-distortion). As one example, the output mechanism 708 may include one or more output lines coupled to a clock and/or one or more output logic circuits to output the modified sample(s). To illustrate, the output mechanism 708 may output the modified sample(s) (e.g., represented by one or more bits) serially and/or in parallel via the one or more output lines.

In some aspects, the adaptive DPD apparatus 702 includes one or more envelope delay line components 710 configured to store one or more envelope values. As one example, the envelope delay line component(s) 710 may include an envelope storage component that has a storage capacity associated with storing an input envelope value (e.g., |x|) as one of multiple envelope values that span a time duration. For instance, the envelope storage component may include memory or a shift register. In some aspects, the envelope storage component may be configured to store multiple envelope values associated with multiple samples of a same I/Q signal, where each envelope value may be associated with a respective sample of the I/Q signal at a respective point in time of the time duration. To illustrate, as the envelope delay line component 710 receives a new input envelope value, the envelope storage component includes one or more logic circuits (e.g., an AND gate, an OR gate, a NAND gate, a NOR gate, an exclusive OR gate, an exclusive NOR gate, a buffer gate, and/or an inverter) to remove an envelope value associated with an oldest point in time and replace the removed envelope value with the new input envelope value (e.g., a circular buffer). Alternatively or additionally, the envelope storage component may include shifting logic that shifts the multiple envelope values one position such that a second oldest envelope value is shifted from a current position in memory into a new position in memory associated with the (removed) oldest envelope value.

The one or more envelope delay line component(s) 710 are coupled to one or more envelope selection components 712 that include selection logic configured to select a subset of envelope values from the multiple envelope values stored by the envelope delay line component(s) 710. As one example, the envelope selection component(s) 712 may include one or more multiplexers that select a subset of envelope values based at least in part on the selected DPD kernel. In some aspects, the envelope selection component(s) 712 may be configured to select the subset of envelope values based at least in part on a timing advance and/or a timing delay relative to a computation time reference (e.g., a current sample being processed with DPD). As one non-limiting example, the envelope selection component(s) 712 may be configured to select the subset of envelope values based at least in part on a sample index as shown by the equation (10) (e.g., "n−1" of $x_{n-1}$). Thus, the envelope selection component(s) 712 may be configured to select any envelope value from the envelope delay line component 710 and, subsequently, an envelope value with any timing advance and/or a timing delay (e.g., relative to the $n^{th}$ sample) stored within the envelope delay line component 710 at discrete times within the time duration. In some aspects, the envelope value delay line component(s) 710 and the one or more envelope selection component(s) 712 may be implemented as a delay line multiplexer component as further described with regard to FIG. 8.

In the example of the adaptive DPD apparatus 702, the envelope selection component(s) 712 are coupled to one or more LUT components, shown as LUT component 714-1, LUT component 714-2, LUT component 714-3, up to LUT component 714-$m$, where m represents an integer. Accordingly, while the example 700 illustrates four LUT components, other examples may include more or fewer LUT components. Collectively, the LUT components may be referred to as the LUT components 714 (e.g., without a sub-designator). A LUT component may include one or more input mechanisms (e.g., one or more input lines), one or more storage components (e.g., memory), and one or more output mechanisms (e.g., one or more output lines). In some aspects, the LUT component may store, in the one or more storage components, multiple envelope computation values associated with a calculation result that is based at least in part on one or more envelope values, such as an envelope power summation computation value as described with regard to equation (9) or an alternate envelope computation value as described with regard to equation (20) and/or equation (21). To illustrate, an LUT component may store a computation of a value associated with an approximation of a piece-wise linear envelope function as described in the equations discussed above. Alternatively or additionally, the LUT component may store, in the one or more storage components, cross-reference information associated with each envelope computation value such that the LUT component may receive a subset of envelope values (e.g., via the input mechanism(s)) and identify an envelope computation value associated with the subset of envelope values. Alternatively or additionally, the cross-reference information may include an indication of a DPD kernel associated with the envelope computation value.

In the example of the adaptive DPD apparatus 702, the LUT components 714 are coupled to an LUT selection component 716. The LUT selection component 716 receives m envelope computation values as input and outputs one or more envelope computation values based at least in part on a selected DPD kernel. As one example, the LUT selection component includes one or more crossbar (XBAR) multiplexers that select one or more envelope computation values based at least in part on the selected DPD kernel. Alternatively or additionally the XBAR multiplexer(s) route the selected envelope computation values to one or more inputs to a combiner component as further described below. The ability to select and route envelope computation values (e.g., by the LUT selection component 716) based at least in part on a selected DPD enables the adaptive DPD apparatus 702 to dynamically change which envelope computation value(s) are input to a combiner component and, subsequently, a type of DPD kernel implemented by the adaptive DPD apparatus. As one non-limiting example, the LUT selection component 716 may first select and route an envelope power summation value from a first LUT component based at least in part on the selected DPD kernel being a GMP kernel. The LUT selection component 716 may be subsequently configured to select a different envelope computation value from a second LUT component based at least in part on the selected DPD kernel changing to a DVR kernel. However, other envelope computation values associated with other types of kernels may be stored by an LUT component, and selected by the LUT selection component.

In some aspects, the adaptive DPD apparatus 702 includes one or more computation delay line components 718 that store multiple computation values. To illustrate, and in a similar manner as described with regard to the envelope delay line component(s) 710, the computation delay line component(s) 718 may include one or more input mechanisms to receive one or more computational values (e.g., generated by a computational circuit), one or more computation storage components with storage capacity for storing multiple computation values, and one or more output mechanisms to output the one or more stored computation values.

As shown by the example 700, the computation delay line component(s) 718 may include multiple computation delay lines, such as a first computation delay line (shown as an x3 delay line) with storage to store multiple computation values associated with a first computation (e.g., $x^3$) and a second computation delay line (shown as an x2 delay line) with storage to store multiple values associated with a second computation (e.g., $x^2$) applied to each sample of the multiple samples. The computation delay line component(s) 718 may alternatively or additionally include a third computation delay line (shown as an A×2 delay line) with storage to store multiple values associated with a third computation (e.g., $|x^2|$) applied to each sample of the multiple samples, and/or a fourth delay line (a samples delay line, shown as an IQ delay line) with storage to store the multiple samples. While the example 700 shows four computation delay lines, other examples may include more or fewer computation delay lines. The computation values stored by the computation delay line component(s) 718 may be configurable based at least in part on the first input mechanism 704 and selection of one or more computational circuits as further described above. Alternatively, the type of computation values (e.g., based at least in part on a computation type applied to a sample) stored by the computation delay line component(s) 718 may be fixed.

The computation delay line component(s) 718 are coupled to one or more computation selection components. To illustrate, and as shown by the example 700, the computation delay line component(s) 718 are coupled to a first set and/or layer of computation selection components, shown as a first computation selection component 720-1 up to a $d^{th}$ computation selection component 720-d, where d is an integer. The first set of computation selection components may be collectively referred to as the computation selection components 720 (e.g., without a sub-designator). The computation delay line components 718 are also coupled to a second set and/or layer of computation delay line components, shown as a single computation selection component 722 for simplicity, but other examples may include multiple computation selection components in the second set of computation components. The first set of computation selection component(s) and/or the second set of computation selection component(s) may be configured to select any computation value from any computation delay line component 718 and, subsequently, a computation value with any timing advance and/or a timing delay (e.g., relative to the $n^{th}$ sample) stored within the computation delay line component 718 at discrete times within the time duration.

In some aspects, each computation selection component may include one or more selection logic circuits configured to select one or more subsets of computational values stored by the computation storage component(s) of the computation delay line component(s) 718. To illustrate, each computation selection component may include one or more multiplexers that select the subset(s) of computational values based at least in part on the selected DPD kernel. As one example, each computation selection component may be coupled to the mapping logic circuit that receives the indication of the selected DPD kernel, where the computation selection component may configure one or more multiplexers to select subset(s) of computational values based at least in part on the selected DPD kernel. As one non-limiting example, each computation selection component may be configured to select the subset(s) of computational values based at least in part on the selected DPD kernel and a mapping specified by the table 602 (e.g., computational values used for q and/or p). To illustrate, the first set of computation selection components (e.g., the computation selection component 720-1 and the computation selection component 720-d) may be dynamically configured (e.g., by way of the input mechanism 704) based at least in part on computation values associated with $p_m$ for the selected DPD kernel. The second set of computation selection components (e.g., the computation selection component 722) may be dynamically configured based at least in part on computation values associated with $q_j$ for the selected DPD kernel. Alternatively or additionally, a computation selection component may be configured to select (and include in the subset of computation values) one or more samples (e.g., from the IQ samples delay line) based at least in part on the selected DPD kernel. In some aspects, the computation selection component may select the computation values and/or samples based at least in part on a timing advance or timing delay associated with q and/or p (e.g. $q_{n-j}$ and/or $p_{n-m}$).

For clarity, the computation selection component 720-1, the computation selection component 720-d, and the computation selection component 722 are shown as separate components separately in the example 700. However, in alternate or additional examples, the computation selection component 720-1, the computation selection component 720-d, and/or the computation selection component 722 may be included in a same (single) component, such as a single multiplexer component and/or a delay line-multiplexer selection component as further described below, that is coupled to one or more of the computational delay line component(s) 718.

As shown by the example 700, the adaptive DPD apparatus 702 includes one or more combiner components that are coupled to one or more computation components. As one example, a first combiner component 724-1 is coupled to the first computation selection component 720-1 up to a $d^{th}$ combiner component 724-d that is coupled to the $d^{th}$ computation selection component 720-d (which are collectively referred to as the combiner components 724). The combiner components 724 are also coupled to the LUT selection component 716 such that each combiner component of the combiner components 724 receives at least a first input from the LUT selection component 716 and at least a second input from a respective computation selection component.

As also shown by the example 700, a combiner component 726 is coupled to the computation selection component 722 and a value selection component 728 (further described below) such that the combiner component 726 receives at least a first input from the computation selection component 722 and at least a second input from the value selection component 728.

Each combiner component includes one or more logic circuits that are configured to generate an output based at least in part on combining one or more envelope computation values with the subset(s) of computational values. As an example, a combiner component may include a multiplier circuit that combines the values using at least a multiplication operation and/or an adder circuit that combines the values using at least a summation operation. To illustrate, an adder circuit of a combiner component (e.g., the combiner component 724-1) couples to a LUT selection component (e.g., the LUT selection component 716), and combines the (approximate) envelope computation values selected and routed by the LUT selection component. As another example, a multiplier circuit of the combiner component couples to one or more computation selection components (e.g., the computation selection component 720-1), and combines the subset(s) of computation values with the (added) envelope computation values.

The value selection component 728 includes logic circuitry that selects, based at least in part on the selected DPD kernel, one or more combined values generated by one or more combiner components (e.g., the combiner component(s) 724) and outputs the selected combined value(s). To illustrate, the value selection component 728 may include one or more multiplexers and/or one or more XBAR multiplexers that select (and/or route) the combined values based at least in part on the selected DPD kernel. The ability to select and route different combined values generated by a combiner component based at least in part on a selected DPD enables the adaptive DPD apparatus 702 to dynamically change which combined value is input to a combiner component (e.g. the combiner component 726) and, subsequently, a type of DPD kernel implemented by the adaptive DPD apparatus 702.

In some aspects, the adaptive DPD component may be implemented, at least in part, as an IC device and/or an SoC device. An IC device may include electronic circuits formed on a semiconductor substrate, such as silicon. Example types of IC devices include memory IC devices (e.g., dynamic random access memory devices or flash memory devices, among other examples), processing IC devices (e.g., microprocessors, digital signal processors, or microcontrollers, computation circuits, among other examples), transceiver IC devices (e.g., RF or mixed-signal transceivers, among other examples), or power amplifier IC devices (e.g., operation amplifier devices, among other examples. An SoC device (e.g., an SoC IC device) may include a combination of one or more types of IC devices.

Structures of an IC device (e.g., transistors, memory cells, logic gates, or interconnects, among other example) may be fabricated using semiconductor fabrication processes that include using deposition, photolithography, and etching techniques. Deposition techniques may form layers of dielectric or conductive materials on or over a semiconductor substrate, after which photolithography and etching techniques may form patterns of structures from the layers of dielectric or conductive materials (e.g., form the transistors, memory cells, logic gates, or interconnects).

As indicated above, FIG. 7 is provided as an example. Other examples may differ from what is described above.

Figure 8:
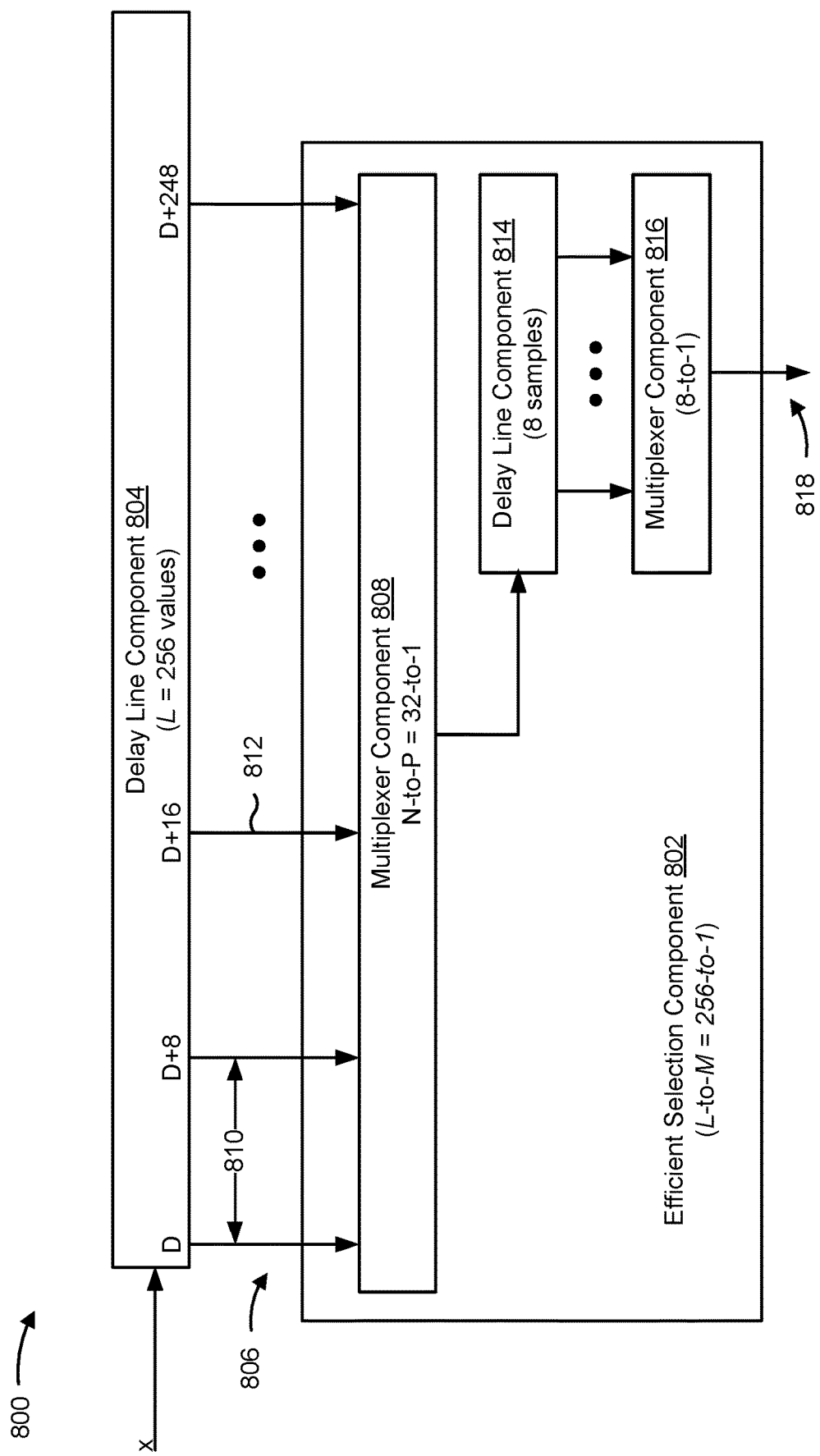
FIG. 8 is a diagram of an example that includes a delay line-multiplexer selection component, in accordance with the present disclosure.

FIG. 8 is a diagram of an example 800 that includes a delay line-multiplexer selection component 802, in accordance with the present disclosure.

The adaptive DPD apparatus 702 described with regard to FIG. 7 includes a variety of selection components that are configured to receive J values as inputs and output a subset of K values based on a selected DPD kernel, where J and K are integers and J>=K. To illustrate, the envelope selection component 712 selects a subset of envelope values stored by the envelope delay line component 710 based at least in part on the selected DPD kernel. Alternatively or additionally, the LUT selection component 716, the computation selection component 720, and/or the value selection component 728 each select a subset of values (e.g., a subset of LUT output values, a subset of computation values, and/or a subset of combined values, respectively) based at least in part on the selected DPD kernel. To illustrate, the envelope selection component 712, the LUT selection component 716, the computation selection component 720, and/or the value selection component 728 may include one or more multiplexer components that are configured to select a respective subset of values based at least in part on the selected DPD kernel.

A complexity of a multiplexer component (e.g., power consumption, size factor, a number of routing lines, and/or a number of digital logic circuits) may be based at least in part on a selection and/or reduction factor performed by the multiplexer component. For example, a first multiplexer component configured to perform a 16-to-1 reduction (e.g., receive 16 input values and output 1 value) may consume less power, use less space, include fewer routing lines, and/or include fewer digital logic circuits (e.g., an AND gate, an OR gate, and/or an inverter) relative to a second multiplexer component configured to perform a 64-to-1 reduction. Thus, increasing a reduction factor performed by a multiplexer component may also increase a number of digital logic circuits included in the multiplexer component such that the multiplexer component consumes an amount of power and/or occupies a space size that exceeds some implementations that have a constraint on power consumption and/or size. Conversely a delay line-multiplexer selection component, such as the delay line-multiplexer component 802, may utilize less power consumption, have a reduced size factor, use fewer routing lines, and/or use fewer digital logic circuits relative to the single multiplexer. Accordingly, the delay line-multiplexer component may satisfy power consumption and/or size constraints for more implementations relative to the single multiplexer configured with a same reduction factor.

In the example 800, the delay line-multiplexer selection component 802 is coupled to a first delay line component 804 that stores L values, where L represents an integer and is shown by the example 800 as having a value of 256. As one example, the first delay line component 804 stores L envelope values or L computation values that are based at least in part on L samples of an I/Q signal. In some aspects, the delay line-multiplexer selection component 802 performs an L-to-M reduction, where M is an integer. As one non-limiting example, the delay line-multiplexer selection component performs a 256-to-1 reduction, where L=256 and M=1.

As shown by reference number 806, the delay line-multiplexer selection component 802 receives a first subset of values stored by the first delay line component 804. To illustrate, the delay line-multiplexer selection component 802 includes a first multiplexer component 808 that receives N input values from the first delay line component 804, where N is an integer and N<M. In some aspects, the N input values are uniformly separated from one another by an offset 810. As one non-limiting example, and as shown by the example 800, the first multiplexer component 808 of the delay line-multiplexer selection component 802 receives a subset of N=32 input values of the L=256 stored by the first delay line component 804, where each received input value is offset (e.g., in storage at the first delay line component 804 and/or in discrete time units) from an adjacent received value by offset=8.

The first multiplexer component 808 performs a N-to-P reduction factor such that the first multiplexer component 808 selects and outputs P values of the one or more of the N received input values, where P is an integer and P<N. As one non-limiting example, the first multiplexer component 808 may be configured to perform a 32-to-1 reduction factor that selects and outputs a value associated with connection 812 based at least in part on a selected DPD kernel as described above. To illustrate, the first multiplexer component 808 may be configured to select the value associated with position D+16 of the first delay line component 804.

As shown by the example 800, the first multiplexer component 808 is coupled to a second delay line component 814 that includes a storage component configured to store R values (e.g., a circular buffer and/or a shift register), where R is an integer equivalent to the offset 810 (shown in the example 800 as having a value of 8). Accordingly, as the first multiplexer component 808 outputs a new value, the second delay line component 814 stores the new value, such as by replacing an oldest value with the new (received) value and/or by shifting R-1 values by one position such that a second oldest value is shifted from a current position in memory into a new position in memory associated with the (removed) oldest value. Thus, after R selections by the first multiplexer component 808 at initialization, the second delay line component 814 stores R values that are sequential in time and updates the R values based at least in part on receiving a new value output by the first multiplexer component 808. To illustrate, and with regard to the above example in which the first multiplexer component 808 selects and outputs the value associated with the D+16 value stored by the first delay line component, the second delay line component 814 stores R samples, each of which represents the D+16 value at a respective discrete point in time.

The second delay line component 814 includes R outputs that are coupled to R inputs of a second multiplexer component 816, and the second multiplexer component 816 selects and outputs S values, where S is an integer and is shown in the example 800 as having a value of 1. To illustrate, the second multiplexer component 816 may select one of the R values stored by the second delay line component 814 (e.g., select one of the 8 stored D+16 values) based at least in part on a selected DPD kernel and/or a discrete time associated with the selected value. The second multiplexer component 816 may output the selected value as shown by reference number 818.

Based at least in part on the first multiplexer component 808, the second delay line component 814, and the second multiplexer component 816, the delay line-multiplexer selection component 802 can perform a L-to-M reduction (e.g., 256-to-1 reduction) with reduced complexity (e.g., fewer digital logic circuits, fewer routing lines) relative to a single multiplexer component that performs the L-to-M reduction. The reduced complexity may result in the delay line-multiplexer selection component 802 consuming less power and/or having a smaller form factor relative to the single multiplexer component that performs the same reduction factor.

As indicated above, FIG. 8 is provided as an example. Other examples may differ from what is described above.

Figure 9A:
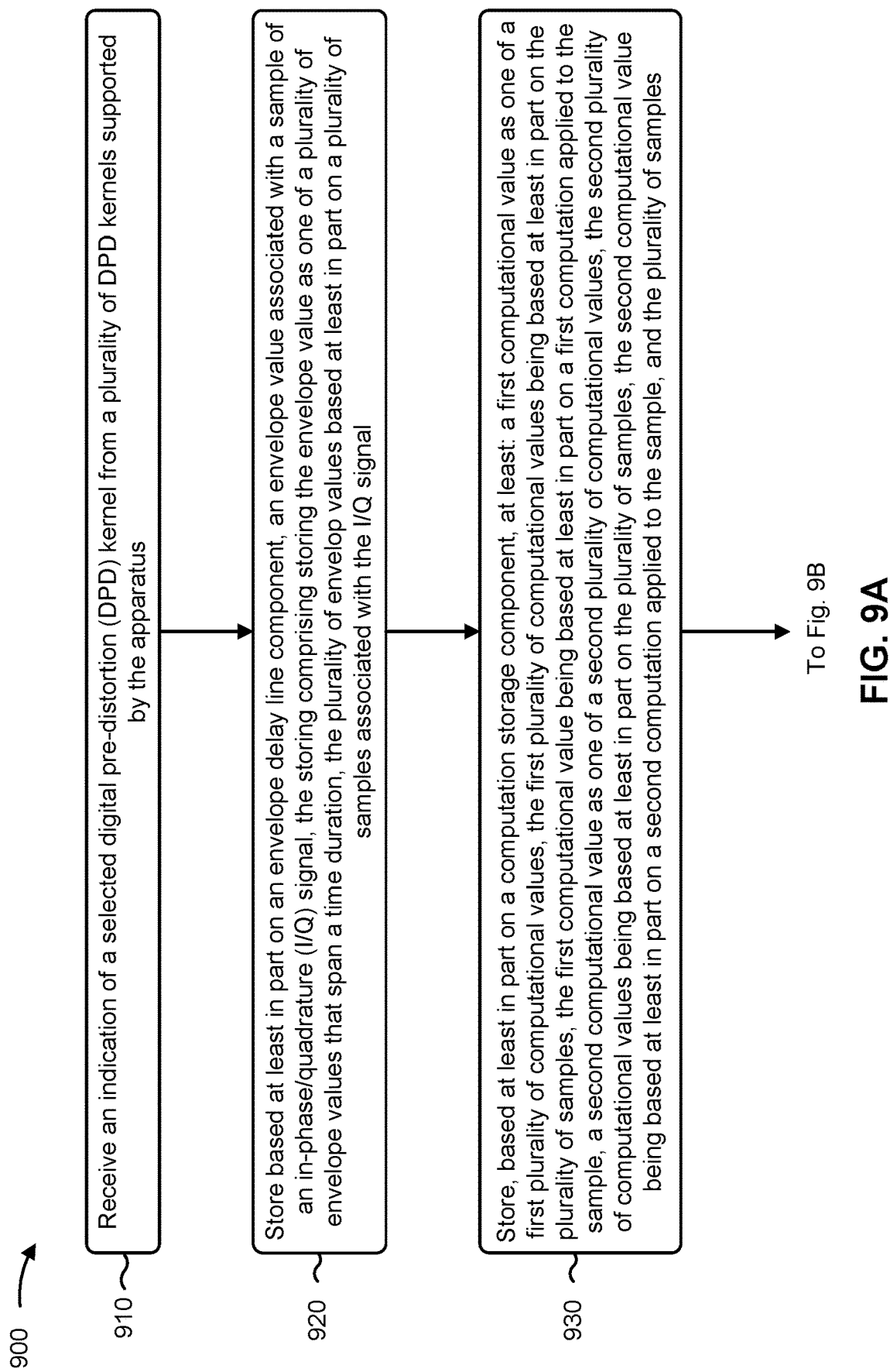

FIGS. 9A and 9B are a diagram illustrating an example process 900 performed, for example, by an apparatus, in accordance with the present disclosure. Example process 900 is an example where the apparatus (e.g., the adaptive DPD apparatus 702) performs operations associated with adaptive digital pre-distortion.

As shown in FIG. 9A, in some aspects, process 900 may include receiving an indication of a selected digital pre-distortion (e.g., using the first input mechanism 704 depicted in FIG. 7) may receive an indication of a selected DPD kernel from a plurality of DPD kernels, as described above.

As further shown in FIG. 9A, in some aspects, process 900 may include storing, based at least in part on an envelope delay line component, an envelope value associated with a sample of an I/Q signal. The storing may include storing the envelope value as one of a plurality of envelope values that span a time duration, where the plurality of envelope values may be based at least in part on a plurality of samples associated with the I/Q signal (block 920). For example, the apparatus (e.g., using the envelope delay line component(s), 710 depicted in FIG. 7) may store, based at least in part on an envelope delay line component, an envelope value associated with a sample of an I/Q signal. The storing may include storing the envelope value as one of a plurality of envelope values that span a time duration, the plurality of envelope values being based at least in part on a plurality of samples associated with the I/Q signal, as described above.

As further shown in FIG. 9A, in some aspects, process 900 may include storing, based at least in part on a computation storage component, at least: a first computational value as one of a first plurality of computational values, the first plurality of computational values being based at least in part on the plurality of samples, the first computational value being based at least in part on a first computation applied to the sample. Alternatively or additionally, the storing may include storing, based at least in part on the computation storage component, a second computational value as one of a second plurality of computational values, the second plurality of computational values being based at least in part on the plurality of samples, the second computational value being based at least in part on a second computation applied to the sample. The storing may include storing, based at least in part on the computation storage component, the plurality of samples (block 930). For example, the apparatus (e.g., using the computational delay line component(s) 718, depicted in FIG. 7) may store, based at least in part on a computation storage component, at least: a first computational value as one of a first plurality of computational values (e.g., where the first plurality of computational values is based at least in part on the plurality of samples and/or the first computational value being is at least in part on a first computation applied to the sample), a second computational value as one of a second plurality of computational values (e.g., where the second plurality of computational values is based at least in part on the plurality of samples and/or the second computational value is based at least in part on a second computation applied to the sample), and the plurality of samples, as described above.

As further shown in FIG. 9B, in some aspects, process 900 may include selecting a subset of envelope values from the plurality of envelope values based at least in part on the selected DPD kernel (block 940). For example, the apparatus (e.g., using the envelope selection component(s) 712, depicted in FIG. 7) may select a subset of envelope values from the plurality of envelope values based at least in part on the selected DPD kernel, as described above.

As further shown in FIG. 9B, in some aspects, process 900 may include generating, based at least in part on the subset of envelope values, at least one LUT component, and the selected DPD kernel, an envelope computation value (block 950). For example, the apparatus may generate, based at least in part on the subset of envelope values, at least one LUT component (e.g., using the LUT component 714-1, the LUT component 714-2, the LUT component 714-3, and/or the LUT component 714-$m$, depicted in FIG. 7), and the selected DPD kernel, an envelope computation value, as described above.

As further shown in FIG. 9B, in some aspects, process 900 may include selecting, based at least in part on the selected DPD kernel, at least one subset of computational values stored by the computation storage component (block 960). For example, the apparatus (e.g., using the computation selection component 720-1, the computation selection component 720-*d*, and/or the computation selection component 722, depicted in FIG. 7) may select, based at least in part on the selected DPD kernel, at least one subset of computational values stored by the computation storage component, as described above.

As further shown in FIG. 9B, in some aspects, process 900 may include generating an output sample that includes digital pre-distortion based at least in part on combining the envelope computation value with the at least one subset of computational values (block 970). For example, the apparatus (e.g., using the combiner component 724-1, the combiner component 724-*d*, the combiner component 726, the LUT selection component 716, and/or the value selection component 728 depicted in FIG. 7) may generate an output sample that includes digital pre-distortion based at least in part on combining the envelope computation value with the at least one subset of computational values, as described above.

Process 900 may include additional aspects, such as any single aspect or any combination of aspects described below and/or in connection with one or more other processes described elsewhere herein.

In a first aspect, the at least one LUT component comprises multiple LUT components, and wherein the method further comprises selecting, using an LUT selection component, a subset of LUT outputs from the multiple LUT components based at least in part on the selected DPD kernel, and inputting the subset of LUT outputs to at least one combiner component configured to generate at least one combined value based at least in part on the subset of LUT outputs and the at least one subset of computational values.

In a second aspect, alone or in combination with the first aspect, the at least one combiner component comprises multiple combiner components, wherein the at least one combined value comprises multiple combined values, and wherein generating the output sample comprises selecting, using at least one value selection component coupled to the multiple combiner components, a subset of combined values output from at least some of the multiple combiner components based at least in part on the selected DPD kernel, and generating the output sample based at least in part on the subset of combined values.

In a third aspect, alone or in combination with one or more of the first and second aspects, selecting the subset of envelope values comprises selecting the subset of envelope values based at least in part on using an delay line-multiplexer selection component.

In a fourth aspect, alone or in combination with one or more of the first through third aspects, the delay line-multiplexer selection component comprises a delay line component, a first multiplexer component coupled to at least one input of the delay line component, and a second multiplexer component coupled to at least one output of the delay line component.

In a fifth aspect, alone or in combination with one or more of the first through fourth aspects, process 900 includes obtaining, from the at least one LUT component, at least one of a first envelope computation value that is based at least in part on a piece-wise linear envelope function associated with a distortion model, or a second envelope computation value that is based at least in part on an approximate envelope power summation calculation.

In a sixth aspect, alone or in combination with one or more of the first through fifth aspects, the piece-wise linear envelope function is associated with a DVR kernel.

In a seventh aspect, alone or in combination with one or more of the first through sixth aspects, process 900 includes storing, based at least in part on the computation storage component, a third computational value as one of a third plurality of computational values that are based at least in part on the plurality of samples, the third computational value being based at least in part on a third computation applied to the sample, wherein the first computation, the second computation, and the third computation are different from one another.

In an eighth aspect, alone or in combination with one or more of the first through seventh aspects, $x_m$ represents an $m^{th}$ sample of the plurality of samples, wherein the first computation, the second computation, or the third computation includes at least one of $x_m$, $x_m^*$, $|x_m|$, $x^2_m$, $x_m^{*2}$, $|x_m|^2$, $x_m^3$, $x_m^{*3}$, $|x_m|^2 x_m$, or $|x_m|^2 x_m^*$.

In a ninth aspect, alone or in combination with one or more of the first through eighth aspects, process 900 includes calculating the first computational value or the second computational value.

In a tenth aspect, alone or in combination with one or more of the first through ninth aspects, process 900 includes receiving, as input, the first computational value or the second computational value.

In an eleventh aspect, alone or in combination with one or more of the first through tenth aspects, the at least one LUT component stores, as the envelope computation value, an envelope power summation value associated with a Volterra-based kernel.

In a twelfth aspect, alone or in combination with one or more of the first through eleventh aspects, the plurality of DPD kernels comprises at least one of a DDR DPD kernel, a GDDR DPD kernel, a GMP DPD kernel, or a DVR DPD kernel.

In a thirteenth aspect, alone or in combination with one or more of the first through twelfth aspects, selecting the at least one subset of envelope values comprises selecting the at least one subset of envelope values based at least in part on a timing advance relative to a computation time reference, or a timing delay relative to the computation time reference.

In a fourteenth aspect, alone or in combination with one or more of the first through thirteenth aspects, storing the first computational value or the second computational value further comprises storing the first computational value based at least in part on a first computation delay line, or storing the second computational value based at least in part on a second computation delay line.

In a fifteenth aspect, alone or in combination with one or more of the first through fourteenth aspects, process 900 includes storing, in a third computation delay line, a third computation value as one of a third plurality of computational values that are based at least in part on a third computation applied to each sample of the plurality of samples.

In a sixteenth aspect, alone or in combination with one or more of the first through fifteenth aspects, process 900 includes storing the plurality of samples in a samples delay line.

In a seventeenth aspect, alone or in combination with one or more of the first through sixteenth aspects, selecting the at least one subset of computational values further comprises selecting, from the plurality of samples and as part of the subset of computational values, at least one sample based at least in part on the selected DPD kernel.

In an eighteenth aspect, alone or in combination with one or more of the first through seventeenth aspects, each sample of the plurality of samples is a complex sample that includes an I-component associated with the I/Q signal and a Q-component associated with the I/Q signal.

In a nineteenth aspect, alone or in combination with one or more of the first through eighteenth aspects, the sample is a first sample, wherein the indication is a first indication, wherein the selected DPD kernel is a first selected DPD kernel, and the method further comprises applying digital pre-distortion to the first sample based at least in part on the first selected DPD kernel, receiving a second indication of a second selected DPD kernel of the plurality of DPD kernels, and reconfiguring the apparatus to apply digital pre-distortion to a second sample based at least in part on the second selected DPD kernel.

Although FIG. 9 shows example blocks of process 900, in some aspects, process 900 may include additional blocks, fewer blocks, different blocks, or differently arranged blocks than those depicted in FIG. 9. Additionally, or alternatively, two or more of the blocks of process 900 may be performed in parallel.

The following provides an overview of some Aspects of the present disclosure:

Aspect 1: An apparatus comprising: a first input mechanism configured to receive an indication of a selected digital pre-distortion (DPD) kernel from a plurality of DPD kernels; an envelope delay line component comprising an envelope storage component configured to store an input envelope value as one of a plurality of envelope values associated with a plurality of samples that are sampled over a time duration; an envelope selection component configured to select a subset of envelope values from the plurality of envelope values based at least in part on the selected DPD kernel; at least one look-up-table (LUT) component coupled to the envelope selection component configured to: receive the subset of envelope values and output an envelope computation value that is based at least in part on the subset of envelope values and the selected DPD kernel; a computation delay line component comprising a computation storage component configured to store at least: a first plurality of computational values that are based at least in part on a first computation applied to each sample of the plurality of samples; a second plurality of computational values that are based at least in part on a second computation applied to each sample of the plurality of samples; and the plurality of samples that span the time duration; at least one computation selection component coupled to the computation delay line component and configured to select, based at least in part on the selected DPD kernel, at least one subset of computational values stored by the computation storage component; and at least one combiner component coupled to the at least one computation selection component and the at least one LUT component, the at least one combiner component configured to generate an output sample based at least in part on combining the envelope computation value with the at least one subset of computational values.

Aspect 2: The apparatus of Aspect 1, wherein the at least one LUT component comprises multiple LUT components, and wherein the apparatus further comprises: at least one LUT selection component that couples the multiple LUT components to the at least one combiner component, the at least one LUT selection component configured to: select a subset of LUT outputs from the multiple LUT components based at least in part on the selected DPD kernel; and input the subset of LUT outputs to the at least one combiner component.

Aspect 3: The apparatus of Aspect 1 or Aspect 2, wherein the at least one combiner component comprises a first set of combiner components and a second combiner component, and wherein the apparatus further comprises: at least one value selection component that couples the first set of combiner components to the second combiner component, the at least one value selection component configured to: select a subset of combined values output from the first set of combiner components based at least in part on the selected DPD kernel; and input the subset of combined values to the second combiner component.

Aspect 4: The apparatus of any one of Aspects 1-3, wherein the envelope selection component comprises a delay line-multiplexer selection component.

Aspect 5: The apparatus of Aspect 4, wherein the delay line-multiplexer selection component comprises: a delay line component; a first multiplexer component coupled to at least one input of the delay line component; and a second multiplexer component coupled to at least one output of the delay line component.

Aspect 6: The apparatus of any one of Aspects 1-5, wherein the at least one LUT component stores at least one envelope computation value that is based at least in part on a piece-wise linear envelope function associated with a distortion model.

Aspect 7: The apparatus of any one of Aspects 1-6, wherein the at least one LUT component stores at least one approximate envelope power summation value that is based at least in part on an approximation of a signal envelope summation function.

Aspect 8: The apparatus of any one of Aspects 1-7, wherein the computation storage component includes additional capacity to store at least: a third plurality of computational values that are based at least in part on a third computation applied to each sample of the plurality of samples.

Aspect 9: The apparatus of any one of Aspects 1-8, wherein the plurality of samples are based at least in part on an in-phase/quadrature (I/Q) signal.

Aspect 10: The apparatus of Aspect 9, wherein each sample of the plurality of samples comprises a complex sample that includes an I-component associated with the I/Q signal and a Q-component associated with the I/Q signal.

Aspect 11: The apparatus of any one of Aspects 1-10, wherein the envelope selection component comprises one or more multiplexers.

Aspect 12: The apparatus of any one of Aspects 1-12, wherein the at least one computation selection component comprises one or more multiplexers.

Aspect 13: The apparatus of any one of Aspects 1-12, wherein the plurality of DPD kernels comprises at least one of: a dynamic deviation reduction (DDR) DPD kernel, a generalized DDR (GDDR) DPD kernel, a generalized memory polynomial (GMP) DPD kernel, or a decomposed vector rotation (DVR) DPD kernel.

Aspect 14: The apparatus of any one of Aspects 1-13, wherein the envelope computation value comprises an envelope power summation value associated with a Volterra-based DPD kernel.

Aspect 15: The apparatus of any one of Aspects 1-15, wherein the envelope computation value is based at least in part on a piece-wise linear envelope function associated with a decomposed vector rotation (DVR) DPD kernel Aspect 16: The apparatus of any one of Aspects 1-16, wherein the envelope selection component comprises a selection circuit configured to select the subset of envelope values based at least in part on at least one of: a timing advance relative to a computation time reference, or a timing delay relative to the computation time reference.

Aspect 17: The apparatus of any one of Aspects 1-16, wherein the computation storage component comprises: a first computation delay line to store the first plurality of computational values; and a second computation delay line to store the second plurality of computational values.

Aspect 18: The apparatus of any one of Aspects 1-17, wherein the computation storage component comprises: a third computation delay line to store a third plurality of computational values that are based at least in part on a third computation applied to each sample of the plurality of samples.

Aspect 19: The apparatus of Aspect 18, wherein the computation storage component comprises: a samples delay line to store the plurality of samples.

Aspect 20: The apparatus of Aspect 19, wherein the plurality of samples comprises a plurality of in-phase/quadrature (I/Q) samples.

Aspect 21: The apparatus of any one of Aspects 1-20, wherein the at least one combiner component comprises at least one of: an adder circuit, or a multiplier circuit.

Aspect 22: The apparatus of any one of Aspects 1-21, wherein the at least one combiner component includes an adder circuit that couples the at least one combiner component to the at least one LUT component.

Aspect 23: The apparatus of any one of Aspects 1-22, wherein the at least one combiner component includes a multiplier circuit that couples the at least one combiner component to the at least one computation selection component.

Aspect 24: The apparatus of any one of Aspects 1-23, wherein the computation selection component includes a selection logic circuit configured to select one or more samples from the plurality of samples, and wherein the at least one combiner component is configured to generate the output sample based at least in part on the selected one or more samples.

Aspect 25: The apparatus of any one of Aspects 1-24, wherein the combiner component includes a logic circuit configured to combine the envelope computation value with the at least one subset of computational values based at least in part on a summation computation.

Aspect 26: A method performed by an apparatus, the method comprising: receiving an indication of a selected digital pre-distortion (DPD) kernel from a plurality of DPD kernels; storing, based at least in part on an envelope delay line component, an envelope value associated with a sample of an in-phase/quadrature (I/Q) signal, the storing comprising storing the envelope value as one of a plurality of envelope values that span a time duration, the plurality of envelope values based at least in part on a plurality of samples associated with the I/Q signal; storing, based at least in part on a computation storage component, at least: a first computational value as one of a first plurality of computational values, the first plurality of computational values being based at least in part on the plurality of samples, the first computational value being based at least in part on a first computation applied to the sample; a second computational value as one of a second plurality of computational values, the second plurality of computational values being based at least in part on the plurality of samples, the second computational value being based at least in part on a second computation applied to the sample; and the plurality of samples; selecting a subset of envelope values from the plurality of envelope values based at least in part on the selected DPD kernel; generating, based at least in part on the subset of envelope values, at least one look-up-table (LUT) component, and the selected DPD kernel, an envelope computation value; selecting, based at least in part on the selected DPD kernel, at least one subset of computational values stored by the computation storage component; and generating an output sample that includes digital pre-distortion based at least in part on combining the envelope computation value with the at least one subset of computational values.

Aspect 27: The method of Aspect 26, wherein the at least one LUT component comprises multiple LUT components, and wherein the method further comprises: selecting, using an LUT selection component, a subset of LUT outputs from the multiple LUT components based at least in part on the selected DPD kernel; and inputting the subset of LUT outputs to at least one combiner component configured to generate at least one combined value based at least in part on the subset of LUT outputs and the at least one subset of computational values.

Aspect 28: The method of Aspect 27, wherein the at least one combiner component comprises multiple combiner components, wherein the at least one combined value comprises multiple combined values, and wherein generating the output sample comprises: selecting, using at least one value selection component coupled to the multiple combiner components, a subset of combined values output from at least some of the multiple combiner components based at least in part on the selected DPD kernel; and generating the output sample based at least in part on the subset of combined values.

Aspect 29: The method of any one of Aspects 26-28, wherein selecting the subset of envelope values comprises: selecting the subset of envelope values based at least in part on using a delay line-multiplexer selection component.

Aspect 30: The method of Aspect 29, wherein the delay line-multiplexer selection component comprises: a delay line component; a first multiplexer component coupled to at least one input of the delay line component; and a second multiplexer component coupled to at least one output of the delay line component.

Aspect 31: The method of any one of Aspects 26-30, wherein generating the envelope computation value comprises: obtaining, from the at least one LUT component, at least one of: a first envelope computation value that is based at least in part on a piece-wise linear envelope function associated with a distortion model; or a second envelope computation value that is based at least in part on an approximate envelope power summation calculation.

Aspect 32: The method of Aspect 31, wherein the piece-wise linear envelope function is associated with a decomposed vector rotation (DVR) DPD kernel.

Aspect 33: The method of any one of Aspects 26-32, further comprising: storing, based at least in part on the computation storage component, a third computational value as one of a third plurality of computational values that are based at least in part on the plurality of samples, the third computational value being based at least in part on a third computation applied to the sample, wherein the first computation, the second computation, and the third computation are different from one another.

Aspect 34: The method of Aspect 33, wherein $x_m$ represents an $m^{th}$ sample of the plurality of samples, wherein the first computation, the second computation, or the third computation comprises at least one of: $x_m$, $x^*_m$, $|x_m|$, $x^2_m$, $x^{*2}_m$, $|x_m|^2$, $x^3_m$, $x^{*3}_m$, $|x_m|^2 x_m$, or $|x_m|^2 x^*_m$.

Aspect 35: The method of any one of Aspects 26-34, further comprising: calculating the first computational value or the second computational value.

Aspect 36: The method of any one of Aspects 26-35, further comprising: receiving, as input, the first computational value or the second computational value.

Aspect 37: The method of any one of Aspects 26-36, wherein the at least one LUT component stores, as the envelope computation value, an envelope power summation value associated with a Volterra-based DPD kernel.

Aspect 38: The method of any one of Aspects 26-37, wherein the plurality of DPD kernels comprises at least one of: a dynamic deviation reduction (DDR) DPD kernel, a generalized DDR (GDDR) DPD kernel, a generalized memory polynomial (GMP) DPD kernel, or a decomposed vector rotation (DVR) DPD kernel.

Aspect 39: The method of any one of Aspects 26-38, wherein selecting the at least one subset of envelope values comprises: selecting the at least one subset of envelope values based at least in part on: a timing advance relative to a computation time reference, or a timing delay relative to the computation time reference.

Aspect 40: The method of any one of Aspects 26-39, wherein storing the first computational value or the second computational value further comprises: storing the first computational value based at least in part on a first computation delay line; or storing the second computational value based at least in part on a second computation delay line.

Aspect 41: The method of Aspect 40, further comprising: storing, in a third computation delay line, a third computation value as one of a third plurality of computational values that are based at least in part on a third computation applied to each sample of the plurality of samples.

Aspect 42: The apparatus of Aspect 41, further comprising: storing the plurality of samples in a samples delay line.

Aspect 43: The method of any one of Aspects 26-42, wherein selecting the at least one subset of computational values further comprises: selecting, from the plurality of samples and as part of the subset of computational values, at least one sample based at least in part on the selected DPD kernel.

Aspect 44: The method of any one of Aspects 26-43, wherein each sample of the plurality of samples is a complex sample that includes an I-component associated with the I/Q signal and a Q-component associated with the I/Q signal.

Aspect 45: The method of any one of Aspects 26-44, wherein the sample is a first sample, wherein the indication is a first indication, wherein the selected DPD kernel is a first selected DPD kernel, and the method further comprises: applying digital pre-distortion to the first sample based at least in part on the first selected DPD kernel; receiving a second indication of a second selected DPD kernel of the plurality of DPD kernels; and reconfiguring the apparatus to apply digital pre-distortion to a second sample based at least in part on the second selected DPD kernel.

Aspect 46: A transceiver apparatus comprising: a power amplifier; a digital-to-analog converter (DAC) coupled to the power amplifier; and an adaptable digital pre-distortion (DPD) apparatus coupled to the DAC, the adaptable DPD apparatus comprising: an envelope delay line component comprising an envelope storage component configured to store a plurality of envelope values associated with a plurality of samples of an in-phase/quadrature (I/Q) signal; an envelope selection component configured to select a subset of envelope values from the plurality of envelope values; at least one look-up-table (LUT) component coupled to the envelope selection component comprising an output mechanism configured to output an envelope computation value that is based at least in part on the subset of envelope values; a computation delay line component comprising a computation storage component configured to store a plurality of computational values that are based at least in part on the plurality of samples; at least one computation selection component coupled to the computation delay line component and configured to select, based at least in part on a selected DPD kernel of a plurality of DPD kernels, at least one subset of computational values stored by the computation storage component; and at least one combiner component coupled to the at least one computation selection component and the at least one LUT component, the at least one combiner component configured to generate an output sample based at least in part on combining the envelope computation value with the at least one subset of computational values.

Aspect 47: An apparatus for wireless communication at a device, comprising a processor; memory coupled with the processor; and instructions stored in the memory and executable by the processor to cause the apparatus to perform the method of one or more of Aspects 26-45.

Aspect 48: A device for wireless communication, comprising a memory and one or more processors coupled to the memory, the one or more processors configured to perform the method of one or more of Aspects 26-45.

Aspect 49: An apparatus for wireless communication, comprising at least one means for performing the method of one or more of Aspects 26-45.

Aspect 50: A non-transitory computer-readable medium storing code for wireless communication, the code comprising instructions executable by a processor to perform the method of one or more of Aspects 26-45.

The foregoing disclosure provides illustration and description but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a "processor" is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods are described herein without reference to specific software code, since those skilled in the art will understand that software and hardware can be designed to implement the systems and/or methods based, at least in part, on the description herein.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. Many of these features may be combined in ways not specifically recited in the claims and/or disclosed in the specification. The disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items and may be used interchangeably with "one or more." Where only one item is intended, the phrase "only one" or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An apparatus comprising:
    a first input mechanism configured to receive an indication of a selected digital pre-distortion (DPD) kernel from a plurality of DPD kernels;
    an envelope delay line component comprising an envelope storage component configured to store an input envelope value as one of a plurality of envelope values associated with a plurality of samples that are sampled over a time duration;
    an envelope selection component configured to select a subset of envelope values from the plurality of envelope values based at least in part on the selected DPD kernel;
    at least one look-up-table (LUT) component coupled to the envelope selection component configured to:
        receive the subset of envelope values and
        output an envelope computation value that is based at least in part on the subset of envelope values and the selected DPD kernel;
    a computation delay line component comprising a computation storage component configured to store at least:
        a first plurality of computational values that are based at least in part on a first computation applied to each sample of the plurality of samples;
        a second plurality of computational values that are based at least in part on a second computation applied to each sample of the plurality of samples; and
        the plurality of samples that span the time duration;
    at least one computation selection component coupled to the computation delay line component and configured to select, based at least in part on the selected DPD kernel, at least one subset of computational values stored by the computation storage component; and
    at least one combiner component coupled to the at least one computation selection component and the at least one LUT component, the at least one combiner component configured to generate an output sample based at least in part on combining the envelope computation value with the at least one subset of computational values.

2. The apparatus of claim 1, wherein the at least one LUT component comprises multiple LUT components, and wherein the apparatus further comprises:
    at least one LUT selection component that couples the multiple LUT components to the at least one combiner component, the at least one LUT selection component configured to:
        select a subset of LUT outputs from the multiple LUT components based at least in part on the selected DPD kernel; and
        input the subset of LUT outputs to the at least one combiner component.

3. The apparatus of claim 1, wherein the at least one combiner component comprises a first set of combiner components and a second combiner component, and wherein the apparatus further comprises:
    at least one value selection component that couples the first set of combiner components to the second combiner component, the at least one value selection component configured to:
        select a subset of combined values output from the first set of combiner components based at least in part on the selected DPD kernel; and
        input the subset of combined values to the second combiner component.

4. The apparatus of claim 1, wherein the envelope selection component comprises a delay line-multiplexer selection component.

5. The apparatus of claim 4, wherein the delay line-multiplexer selection component comprises:
    a delay line component;
    a first multiplexer component coupled to at least one input of the delay line component; and
    a second multiplexer component coupled to at least one output of the delay line component.

6. The apparatus of claim 1, wherein the at least one LUT component stores at least one envelope computation value that is based at least in part on a piece-wise linear envelope function associated with a distortion model.

7. The apparatus of claim 1, wherein the at least one LUT component stores at least one approximate envelope power summation value that is based at least in part on an approximation of a signal envelope summation function.

8. The apparatus of claim 1, wherein the plurality of DPD kernels comprises at least one of:
    a dynamic deviation reduction (DDR) DPD kernel,
    a generalized DDR (GDDR) DPD kernel,
    a generalized memory polynomial (GMP) DPD kernel, or
    a decomposed vector rotation (DVR) DPD kernel.

9. The apparatus of claim 1, wherein the envelope computation value comprises an envelope power summation value associated with a Volterra-based DPD kernel.

10. The apparatus of claim 1, wherein the envelope computation value is based at least in part on a piece-wise linear envelope function associated with a decomposed vector rotation (DVR) DPD kernel.

11. The apparatus of claim 1, wherein the envelope selection component comprises a selection circuit configured to select the subset of envelope values based at least in part on at least one of:
a timing advance relative to a computation time reference, or
a timing delay relative to the computation time reference.

12. The apparatus of claim 1, wherein the computation storage component comprises:
a first computation delay line to store the first plurality of computational values; and
a second computation delay line to store the second plurality of computational values.

13. The apparatus of claim 1, wherein the computation selection component includes a selection logic circuit configured to select one or more samples from the plurality of samples, and
wherein the at least one combiner component is configured to generate the output sample based at least in part on the one or more samples.

14. The apparatus of claim 1, wherein the at least one combiner component includes a logic circuit configured to combine the envelope computation value with the at least one subset of computational values based at least in part on a summation computation.

15. A method performed by an apparatus, the method comprising:
receiving an indication of a selected digital pre-distortion (DPD) kernel from a plurality of DPD kernels;
storing, based at least in part on an envelope delay line component, an envelope value associated with a sample of an in-phase/quadrature (I/Q) signal, the storing comprising storing the envelope value as one of a plurality of envelope values that span a time duration, the plurality of envelope values based at least in part on a plurality of samples associated with the I/Q signal;
storing, based at least in part on a computation storage component, at least:
a first computational value as one of a first plurality of computational values, the first plurality of computational values being based at least in part on the plurality of samples, the first computational value being based at least in part on a first computation applied to the sample;
a second computational value as one of a second plurality of computational values, the second plurality of computational values being based at least in part on the plurality of samples, the second computational value being based at least in part on a second computation applied to the sample; and
the plurality of samples;
selecting a subset of envelope values from the plurality of envelope values based at least in part on the selected DPD kernel;
generating, based at least in part on the subset of envelope values, at least one look-up-table (LUT) component, and the selected DPD kernel, an envelope computation value;
selecting, based at least in part on the selected DPD kernel, at least one subset of computational values stored by the computation storage component; and
generating an output sample that includes digital pre-distortion based at least in part on combining the envelope computation value with the at least one subset of computational values.

16. The method of claim 15, wherein the at least one LUT component comprises multiple LUT components, and wherein the method further comprises:
selecting, using an LUT selection component, a subset of LUT outputs from the multiple LUT components based at least in part on the selected DPD kernel; and
inputting the subset of LUT outputs to at least one combiner component configured to generate at least one combined value based at least in part on the subset of LUT outputs and the at least one subset of computational values.

17. The method of claim 16, wherein the at least one combiner component comprises multiple combiner components,
wherein the at least one combined value comprises multiple combined values, and
wherein generating the output sample comprises:
selecting, using at least one value selection component coupled to the multiple combiner components, a subset of combined values output from at least some of the multiple combiner components based at least in part on the selected DPD kernel; and
generating the output sample based at least in part on the subset of combined values.

18. The method of claim 15, wherein selecting the subset of envelope values comprises:
selecting the subset of envelope values based at least in part on using a delay line-multiplexer selection component.

19. The method of claim 18, wherein the delay line-multiplexer selection component comprises:
a delay line component;
a first multiplexer component coupled to at least one input of the delay line component; and
a second multiplexer component coupled to at least one output of the delay line component.

20. The method of claim 15 wherein generating the envelope computation value comprises:
obtaining, from the at least one LUT component, at least one of:
a first envelope computation value that is based at least in part on a piece-wise linear envelope function associated with a distortion model; or
a second envelope computation value that is based at least in part on an approximate envelope power summation calculation.

21. The method of claim 20, wherein the piece-wise linear envelope function is associated with a decomposed vector rotation (DVR) DPD kernel.

22. The method of claim 15, further comprising:
storing, based at least in part on the computation storage component, a third computational value as one of a third plurality of computational values that are based at least in part on the plurality of samples, the third computational value being based at least in part on a third computation applied to the sample,
wherein the first computation, the second computation, and the third computation are different from one another.

23. The method of claim 22, wherein $x_m$ represents an $m^{th}$ sample of the plurality of samples, wherein the first computation, the second computation, or the third computation comprises at least one of:
$x_m$,
$x^*_m$,
$|x_m|$,
$x^2_m$, $x^{*2}_m$,
$|x_m|^2$,
$x^3_m$,
$x^{*3}_m$,
$|x_m|^2 x_m$, or
$|x_m|^2 x^*_m$.

24. The method of claim 15, wherein the at least one LUT component stores, as the envelope computation value, an envelope power summation value associated with a Volterra-based DPD kernel.

25. The method of claim 15, wherein the plurality of DPD kernels comprises at least one of:
 a dynamic deviation reduction (DDR) DPD kernel,
 a generalized DDR (GDDR) DPD kernel,
 a generalized memory polynomial (GMP) DPD kernel, or
 a decomposed vector rotation (DVR) DPD kernel.

26. The method of claim 15, wherein storing the first computational value or the second computational value further comprises:
 storing the first computational value based at least in part on a first computation delay line; or
 storing the second computational value based at least in part on a second computation delay line.

27. The method of claim 15, wherein selecting the at least one subset of computational values further comprises:
 selecting, from the plurality of samples and as part of the subset of computational values, at least one sample based at least in part on the selected DPD kernel.

28. The method of claim 15, wherein the sample is a first sample, wherein the indication is a first indication, wherein the selected DPD kernel is a first selected DPD kernel, and the method further comprises:
 applying digital pre-distortion to the first sample based at least in part on the first selected DPD kernel;
 receiving a second indication of a second selected DPD kernel of the plurality of DPD kernels; and
 reconfiguring the apparatus to apply digital pre-distortion to a second sample based at least in part on the second selected DPD kernel.

29. A transceiver apparatus comprising:
 a power amplifier;
 a digital-to-analog converter (DAC) coupled to the power amplifier; and
 an adaptable digital pre-distortion (DPD) apparatus coupled to the DAC, the adaptable DPD apparatus comprising:
  an envelope delay line component comprising an envelope storage component configured to store a plurality of envelope values associated with a plurality of samples of an in-phase/quadrature (I/Q) signal;
  an envelope selection component configured to select a subset of envelope values from the plurality of envelope values;
  at least one look-up-table (LUT) component coupled to the envelope selection component comprising an output mechanism configured to output an envelope computation value that is based at least in part on the subset of envelope values;
  a computation delay line component comprising a computation storage component configured to store a plurality of computational values that are based at least in part on the plurality of samples;
  at least one computation selection component coupled to the computation delay line component and configured to select, based at least in part on a selected DPD kernel of a plurality of DPD kernels, at least one subset of computational values stored by the computation storage component; and
  at least one combiner component coupled to the at least one computation selection component and the at least one LUT component, the at least one combiner component configured to generate an output sample based at least in part on combining the envelope computation value with the at least one subset of computational values.

30. An apparatus, comprising:
a memory; and
one or more processors, coupled to the memory, configured to:
 receive an indication of a selected digital pre-distortion (DPD) kernel from a plurality of DPD kernels;
 store, based at least in part on an envelope delay line component, an envelope value associated with a sample of an in-phase/quadrature (I/Q) signal, the storing comprising storing the envelope value as one of a plurality of envelope values that span a time duration, the plurality of envelope values based at least in part on a plurality of samples associated with the I/Q signal;
 store, based at least in part on a computation storage component, at least:
  a first computational value as one of a first plurality of computational values, the first plurality of computational values being based at least in part on the plurality of samples, the first computational value being based at least in part on a first computation applied to the sample;
  a second computational value as one of a second plurality of computational values, the second plurality of computational values being based at least in part on the plurality of samples, the second computational value being based at least in part on a second computation applied to the sample; and
  the plurality of samples;
 select a subset of envelope values from the plurality of envelope values based at least in part on the selected DPD kernel;
 generate, based at least in part on the subset of envelope values, at least one look-up-table (LUT) component, and the selected DPD kernel, an envelope computation value;
 select, based at least in part on the selected DPD kernel, at least one subset of computational values stored by the computation storage component; and
 generate an output sample that includes digital pre-distortion based at least in part on combining the envelope computation value with the at least one subset of computational values.

* * * * *